US008828627B2

(12) United States Patent
Hayashi

(10) Patent No.: US 8,828,627 B2
(45) Date of Patent: Sep. 9, 2014

(54) REFLECTIVE MASK BLANK FOR EUV LITHOGRAPHY AND REFLECTIVE MASK FOR EUV LITHOGRAPHY

(71) Applicant: Asahi Glass Company, Limited, Chiyoda-ku (JP)

(72) Inventor: Kazuyuki Hayashi, Yokohama (JP)

(73) Assignee: Asahi Glass Company, Limited, Chiyoda-ku, Tokyo (JP)

( * ) Notice: Subject to any disclaimer, the term of this patent is extended or adjusted under 35 U.S.C. 154(b) by 33 days.

(21) Appl. No.: 13/739,373

(22) Filed: Jan. 11, 2013

(65) Prior Publication Data
US 2013/0196255 A1 Aug. 1, 2013

(30) Foreign Application Priority Data

Jan. 30, 2012 (JP) .................. 2012-016597
Aug. 7, 2012 (JP) .................. 2012-174704
Nov. 14, 2012 (JP) .................. 2012-250089

(51) Int. Cl.
*G03F 1/22* (2012.01)
*G03F 1/24* (2012.01)

(52) U.S. Cl.
USPC ............................................. 430/5

(58) Field of Classification Search
USPC ................. 430/5, 322, 323, 394; 378/35
See application file for complete search history.

(56) References Cited

U.S. PATENT DOCUMENTS

| 7,390,596 B2 | 6/2008 | Ishibashi et al. |
| 7,556,894 B2 * | 7/2009 | Yan .................. 430/5 |
| 7,713,666 B2 | 5/2010 | Hayashi et al. |
| 7,718,324 B2 | 5/2010 | Hayashi et al. |
| 7,833,682 B2 | 11/2010 | Hayashi et al. |
| 7,855,036 B2 | 12/2010 | Hayashi et al. |
| 7,906,259 B2 | 3/2011 | Hayashi et al. |
| 7,932,002 B2 | 4/2011 | Takai |
| 7,960,076 B2 | 6/2011 | Kamo et al. |

(Continued)

FOREIGN PATENT DOCUMENTS

| JP | 2004-6798 | 1/2004 |
| JP | 2006-228766 | 8/2006 |

(Continued)

OTHER PUBLICATIONS

U.S. Appl. No. 13/956,691, filed Aug. 1, 2013, Hayashi, et al.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

A reflective mask for an extreme ultra violet (EUV) lithography obtained by forming a mask pattern in an absorber layer of an reflective mask blank is useful in semiconductor production. The EUV reflective mask has two regions of a mask pattern region and a region outside the mask pattern region. The mask pattern region has the absorber layer and a non-absorber layer on the reflective layer of an substrate, wherein the region outside the mask pattern region has an EUV reflective layer, an EUV absorber layer, and a light shielding layer for suppressing reflection of EUV light and DUV-Vis light having a wavelength of from 190 to 500 nm. The EUV reflective mask reduces unnecessary exposure of resist formed on a substrate to reflected light from the region outside the mask pattern region and reduces a pattern size to produce an accurate transfer pattern.

22 Claims, 3 Drawing Sheets

(56) References Cited

U.S. PATENT DOCUMENTS

| | | |
|---|---|---|
| 8,029,950 B2 | 10/2011 | Hayashi et al. |
| 8,088,538 B2 | 1/2012 | Hayashi et al. |
| 8,133,643 B2 | 3/2012 | Hayashi |
| 8,137,872 B2 | 3/2012 | Hayashi |
| 8,168,352 B2 | 5/2012 | Hayashi et al. |
| 8,227,152 B2 | 7/2012 | Hayashi |
| 8,288,062 B2 | 10/2012 | Hayashi et al. |
| 2006/0251973 A1 | 11/2006 | Takaki et al. |
| 2011/0117479 A1 | 5/2011 | Suga et al. |
| 2012/0322000 A1 | 12/2012 | Uno et al. |

FOREIGN PATENT DOCUMENTS

| | | |
|---|---|---|
| JP | 2009-141223 | 6/2009 |
| JP | 2009-212220 | 9/2009 |
| JP | 2010/007955 | 1/2010 |
| JP | 2011-108942 | 6/2011 |

OTHER PUBLICATIONS

U.S. Appl. No. 13/775,412, filed Feb. 25, 2013, Hayashi.

* cited by examiner

REFLECTIVE MASK BLANK FOR EUV LITHOGRAPHY AND REFLECTIVE MASK FOR EUV LITHOGRAPHY

FIELD OF INVENTION

The present invention relates to a reflective mask blank for EUV (Extreme Ultra Violet) lithography (in this specification, hereinafter also referred to as "EUV mask blank") to be used for e.g. production of semiconductors, and a reflective mask (in this specification, hereinafter also referred to as "EUV mask") obtained by forming a mask pattern in an absorber layer of such an EUV mask blank.

BACKGROUND OF INVENTION

Heretofore, in the semiconductor industry, a photolithography method employing visible light or ultraviolet light has been used as a technique to transfer a fine pattern required to form an integrated circuit of a fine pattern on e.g. a Si substrate. However, the conventional photolithography method has come close to its limit, while miniaturization of semiconductor devices has been accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (wavelength: 193 nm) is employed, about 45 nm is presumed to be the limit. From this point of view, EUV lithography, which is an exposure technique employing EUV light having a wavelength further shorter than ArF laser, is expected to be prospective as an exposure technique for 45 nm or below. In this specification, EUV light means a light ray having a wavelength within a soft X-ray region or within a vacuum ultraviolet region, specifically a light ray having a wavelength of from about 10 to 20 nm, particularly about 13.5 nm±0.3 nm.

EUV light is likely to be absorbed by all kinds of substances, and the refractive indices of substances at such a wavelength are close to 1, whereby it is not possible to use a conventional dioptric system like photolithography employing visible light or ultraviolet light. For this reason, for EUV lithography, a catoptric system, i.e. a reflective photomask (hereinafter also referred to as "EUV mask") and a mirror, is employed.

A mask blank is a stacked structure for a photomask, which has not been patterned yet. In the case of an EUV mask blank, it has a structure wherein a reflective layer for reflecting EUV light and an absorber layer for absorbing EUV light, are formed in this order on a substrate made of e.g. glass (Patent Document 1). Besides these layers, such an EUV mask blank usually has a protective layer for protecting the reflective layer at the time of forming a mask pattern in the absorber layer, between the reflective layer and the absorber layer. Further, a low reflective layer is usually formed on the absorber layer for improving contrast at the time of inspection of the mask pattern.

In an EUV mask blank, the thickness of the absorber layer is preferably thin. In EUV lithography, exposure light is not incident from a perpendicular direction to an EUV mask but incident from a direction at an angle of a few degrees, usually 6 degrees, to the perpendicular direction. If the thickness of the absorber layer is thick, at the time of EUV lithography, a shadow by the exposure light arises on a mask pattern formed by removing a part of the absorber layer by etching, and the form accuracy or the dimension accuracy of a mask pattern (hereinafter referred to as "transfer pattern") transferred to a resist on a substrate such as a Si wafer by using the EUV mask, tends to be deteriorated. Since this problem becomes more significant as the line width of the mask pattern formed on the EUV mask becomes smaller, the thickness of the absorber layer of the EUV mask blank is required to be thinner.

Ideally, a material having a high extinction coefficient for EUV light should be employed for the absorber layer of the EUV mask blank, and the thickness should be such that EUV light incident into a surface of the absorber layer is completely absorbed. However, as described above, since the thickness of the absorber layer is required to be thin, it is not possible for the absorber layer to completely absorb EUV light incident into the layer, and a part of the light becomes reflected light.

What is required when a transfer pattern is formed on a resist formed on a substrate by EUV lithography is the contrast of reflected light from the EUV mask, that is, the contrast between reflected light from a portion of the mask wherein the absorber layer is removed at the time of forming the mask pattern so that the reflective layer is exposed to the outside, and reflected light from a portion of the mask wherein the absorber layer is not removed at the time of forming the mask pattern. Accordingly, it has been considered that so long as a sufficient contrast of reflected light is secured, there is no problem even if the incident EUV light is not completely absorbed by the absorber layer. Based on the above concept, Patent Document 2 proposes an EUV mask using the principle of phase shift to reduce the thickness of the absorber layer.

However, in the above principle and the layer construction, although there is no problem for a real mask pattern region (a region wherein a mask pattern is formed, which is used for pattern-transferring at the time of EUVL), there is a problem for a region outside the pattern area. This point will be hereinafter described with reference to FIG. 7. FIG. 7 is a schematic cross-sectional view of an example of EUV mask after a pattern is formed, wherein a substrate 120 has a reflective layer 130 and an absorber layer 140 in this order thereon, and in a mask pattern region 210, a mask pattern formed by partially removing the absorber layer 140, is present. In the mask pattern region 210 of an EUV mask 100, by the above principle of phase shift, a reflection contrast between a surface of the reflective layer 130 and a surface of the absorber layer 140 can be sufficiently maintained. However, the region really irradiated with EUV light is a real exposure region 200. Accordingly, a region 220 outside the mask pattern region 210 is also irradiated with EUV light. At this time, since the effect of phase shift with reflected light from the reflective layer 130 is not sufficiently obtained, a resist on a Si substrate is irradiated with EUV light from the surface of the absorber layer 140, and there may occur a problem of unnecessary exposure of resist. Particularly, at the time of carrying out an overlay exposure, this problem becomes significant.

In order to solve such a problem, Patent Document 3 proposes a structure wherein an absorber film (a second absorber film) which absorbs EUV light is newly stacked outside the mask pattern region 210. In Patent Document 3, a Cr film is formed as a second absorber film.

Further, Patent Document 4 proposes forming a groove-like light-shielding band by removing a reflective layer 130 so as to contact and surround the outer circumference of the mask pattern region 210.

Among such methods, if the method of forming a light-shielding band is employed, the film stress of the EUV mask may be loosened by removing the reflective layer, and the position accuracy may be deteriorated, and accordingly, the method of stacking a film which absorbs EUV light, outside the mask pattern region 210 is more preferred.

PRIOR ART DOCUMENTS

Patent Documents

Patent Document 1: JP-A-2004-6798
Patent Document 2: JP-A-2006-228766
Patent Document 3: JP-A-2009-141223
Patent Document 4: JP-A-2011-108942

SUMMARY OF INVENTION

Technical Problem

However, irradiation light from an EUV light source contains not only a light having a wavelength within the EUV light region (from 10 to 20 nm) but also a light of from deep ultraviolet light to visible light, specifically a light having a wavelength of from 190 to 500 nm (hereinafter referred to as "DUV-Vis light"), and recently, it has become clear that a resist is photosensitive to such DUV-Vis light.

In the technique disclosed in Patent Document 3, a Cr film as a film absorbing EUV light is stacked outside the mask pattern region. When a Cr film is used, it is effective because it has a low reflectivity against a light having a wavelength within EUV light region; however, it has a high reflectivity against DUV-Vis light, and there is a concern about exposure of a resist to reflected light of DUV-Vis light.

It is considered that since an absorber layer does not have an effect to reduce reflected light of DUV-Vis light, reflectivity against EUV light reflected from is sufficiently low, and accordingly, a problem of exposure of a resist to reflected light of DUV-Vis light may arise even for an EUV mask wherein the phase shift principle is not used.

In order to solve the above problem of conventional art, the present invention is to provide an EUV mask wherein influence by reflected light from a region outside a mask pattern region, specifically, a reflected light within a wavelength range of EUV light and a reflected light within a wavelength range of DUV-Vis light are suppressed, and an EUV mask blank used for production of such an EUV mask.

Solution to Problem

In order to solve the above problem, the present invention provides a reflective mask for EUVL (EUV mask (A) of the present invention) having a mask pattern region and a region outside the mask pattern region on a substrate, wherein
  in the mask pattern region, a reflective layer for reflecting EUV light is formed on the substrate, and on the reflective layer, a portion having an absorber layer for absorbing EUV light provided and a portion having no absorber layer provided are arranged to form a mask pattern; and
  in the region outside the mask pattern region, a reflective layer for reflecting EUV light, an absorber layer for absorbing EUV light and a light shielding layer for suppressing reflection of EUV light and DUV-Vis light having a wavelength of from 190 to 500 nm are formed in this order on the substrate; and
  wherein in the region outside the mask pattern region, the average EUV reflectivity at a wavelength range of from 13.3 to 13.7 nm from the surface of the light shielding layer is less than 0.5%, and the DUV-Vis reflectivity at a wavelength of from 190 to 500 nm from the surface of the light shielding layer is at most 30%.

Further, the present invention provides a reflective mask for EUVL (EUV mask (B) of the present invention) having a mask pattern region and a region outside the mask pattern region on a substrate, wherein
  in the mask pattern region, a reflective layer for reflecting EUV light is formed on the substrate, and on the reflective layer, a portion having an absorber layer for absorbing EUV light and a low reflective layer for improving contrast at the time of inspection of a mask pattern, provided in this order, and a portion having no absorber layer or low reflective layer provided are arranged to form a mask pattern; and
  in the region outside the mask pattern region, a reflective layer for reflecting EUV light, an absorber layer for absorbing EUV light, a low reflective layer for improving contrast at the time of pattern inspection and a light shielding layer for suppressing reflection of EUV light and DUV-Vis light are formed in this order on the substrate; and
  wherein in the region outside the mask pattern region, the average EUV reflectivity at a wavelength range of from 13.3 to 13.7 nm from the surface of the light shielding layer is less than 0.5%, and the DUV-Vis reflectivity at a wavelength of from 190 to 500 nm from the surface of the light shielding layer is at most 30%.

In the EUV masks (A) and (B) of the present invention, it is preferred that the light shielding layer contains chromium (Cr) and oxygen (O), and in the light shielding layer, the Cr content is from 15 to 40 at %, and the O content is from 60 to 85 at %.

The light shielding layer may be a film having a gradient composition wherein the O content in the light shielding layer varies in the thickness direction of the light shielding layer so that the O content is high on the surface side, and the O content is low on the substrate side. In a case where the light shielding layer is such a film having a gradient composition, it is preferred that in the light shielding layer, the O content is from 70 at % to 85 at % on the surface side, and the O content is from 60 at % to 70 at % on the substrate side.

Further, in the EUV masks (A) and (B) of the present invention, it is preferred that the light shielding layer contains chromium (Cr), oxygen (O) and nitrogen (N); and in the light shielding layer, the Cr content is from 15 to 40 at %, the total content of O and N is from 60 to 85 at %, and the compositional ratio of O to N is from 9:1 to 5:5.

The light shielding layer may be a film having a gradient composition wherein the O content in the light shielding layer varies gradually in the thickness direction of the light shielding layer so that the O content is high on the surface side, and the O content is low on the substrate side. In a case where the light shielding layer is such a film having a gradient composition, it is preferred that in the light shielding layer, the O content is from 35 at % to 75 at % on the surface side, and the O content is from 25 to 35 at % on the substrate side.

Further, in the EUV masks (A) and (B) of the present invention, it is preferred that the light shielding layer has a two-layer structure comprising a layer on the surface side (in this description, hereinafter referred to as "upper layer of the light shielding layer") and a layer on the substrate side (in this description, hereinafter referred to as "lower layer of the light shielding layer"), wherein:
  the upper layer of the light shielding layer contains chromium (Cr) and oxygen (O); and the Cr content is from 15 to 40 at %, and the O content is from 60 to 85 at %; and
  the lower layer of the light shielding layer contains Cr and nitrogen (N); and the Cr content is from 40 to 97 at %, and the N content is from 3 to 60 at %.

Further, in the EUV masks (A) and (B) of the present invention, it is preferred that the light shielding layer has a two-layer structure comprising an upper layer and a lower layer, wherein:

the upper layer of the light shielding layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and the lower layer of the light shielding layer contains Cr and N; and the Cr content is from 40 to 97 at %, and the N content is from 3 to 60 at %.

Further, in the EUV masks (A) and (B) of the present invention, it is preferred that the light shielding layer has a two-layer structure comprising an upper layer and a lower layer, wherein:

the upper layer of the light shielding layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and the lower layer of the light shielding layer contains chromium (Cr) and oxygen (O); and the Cr content is from 50 to 80 at %, and the O content is from 20 to 50 at %.

Further, in the EUV masks (A) and (B) of the present invention, it is preferred that the light shielding layer has a two-layer structure comprising an upper layer and a lower layer, wherein:

the upper layer of the light shielding layer contains chromium (Cr) and oxygen (O); and the Cr content is from 15 to 40 at %, and the O content is from 60 to 85 at %; and the lower layer of the light shielding layer contains chromium (Cr), oxygen (O) and nitrogen (N); and the Cr content is from 50 to 80 at %, the total content of O and N is from 20 to 50 at %, and the compositional ratio of O to N is from 3:7 to 2:8.

Further, in the EUV masks (A) and (B) of the present invention, in a case where the light shielding layer has such a two-layer structure, it is preferred that at least one of the upper layer and the lower layer is further divided into two or more layers.

Further, in the EUV masks (A) and (B) of the present invention, in a case where the light shielding layer has such a two-layer structure, an interlayer may be present between the upper layer and the lower layer.

Further, in the EUV masks (A) and (B) of the present invention, the light shielding layer may have a multilayer structure having at least 3 layers, wherein a first layer and a second layer which are alternately stacked from the absorber layer side, wherein:

each of the first layer and the second layer is selected from the group consisting of a film containing chromium (Cr) and oxygen (O), a film containing chromium (Cr) and nitrogen (N) and a film containing chromium (Cr), oxygen (O) and nitrogen (N), provided that the film compositions of the first layer and the second layer are different from each other.

In the multilayer structure, it is preferred that:

the first layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and the second layer contains Cr and nitrogen (N); and the Cr content is from 40 to 97 at %, and the N content is from 3 to 60 at %.

Further, the multilayer structure is preferably such that the number of layers constituted by stacking the first layer and the second layer is within the range of from 3 to 20.

Further, in the multilayer structure, an interlayer may be present between the first layer and the second layer.

Further, in the EUV masks (A) and (B) of the present invention, the thickness of the light shielding layer is preferably from 10 to 100 nm.

In a case where the light shielding layer has the above two-layer structure, it is preferred that the thickness of the upper layer is from 5 to 80 nm, the thickness of the lower layer is from 5 to 80 nm, and the total thickness of the upper layer and the lower layer is from 10 to 100 nm.

Further, in a case where the light shielding layer has the above multilayer structure, the total thickness of the multilayer structure is preferably from 10 to 100 nm.

Further, in the EUV masks (A) and (B) of the present invention, the absorber layer is preferably composed mainly of tantalum (Ta).

Further, in the EUV masks (A) and (B) of the present invention, the thickness of the absorber layer is preferably from 20 to 90 nm.

Further, in the EUV mask (B) of the present invention, the low reflective layer is preferably composed mainly of tantalum (Ta) and oxygen (O).

Further, in the EUV mask (B) of the present invention, it is preferred that the thickness of the low reflective layer is from 2 to 10 nm, and the total thickness of the low reflective layer and the absorber layer is from 30 to 90 nm.

In the EUV mask (A) of the present invention, the absorber layer may be a layer such that the phase of the EUV light reflected from the surface of the absorber layer is different from the phase of the EUV light reflected from the reflective layer by from 175 to 185 degrees.

In the EUV mask (B) of the present invention, the low reflective layer may be a low reflective layer such that the phase of the EUV light reflected from the surface of the low reflective layer is different from the phase of the EUV light reflected from the reflective layer by from 175 to 185 degrees.

Further, the present invention provides a reflective mask blank for EUVL (EUV mask blank (A) of the present invention), having a reflective layer for reflecting EUV light, an absorber layer for absorbing EUV light and a light shielding layer for suppressing reflection of EUV light and DUV-Vis light, formed in this order on a substrate, wherein the average EUV reflectivity at a wavelength range of from 13.3 to 13.7 nm from the surface of the light shielding layer is less than 0.5%, and the DUV-Vis reflectivity at a wavelength of from 190 to 500 nm from the surface of the light shielding layer is at most 30%.

Further, the present invention provides a reflective mask blank for EUVL (EUV mask blank (B) of the present invention), having a reflective layer for reflecting EUV light, an absorber layer for absorbing EUV light, a low reflective layer for improving contrast at the time of pattern inspection and a light shielding layer for suppressing reflection of EUV light and DUV-Vis light, formed in this order on a substrate, wherein the average EUV reflectivity at a wavelength range of from 13.3 to 13.7 nm from the surface of the light shielding layer is less than 0.5%, and the DUV-Vis reflectivity at a wavelength of from 190 to 500 nm from the surface of the light shielding layer is at most 30%.

In the EUV mask blanks (A) and (B) of the present invention, it is preferred that the light shielding layer contains chromium (Cr) and oxygen (O), and in the light shielding layer, the Cr content is from 15 to 40 at %, and the O content is from 60 to 85 at %.

The light shielding layer may be a film having a gradient composition wherein the O content in the light shielding layer varies in the thickness direction of the light shielding layer so that the O content is high on the surface side, and the O content is low on the substrate side. In a case where the light shielding layer is such a film having a gradient composition, it is preferred that in the light shielding layer, the O content is from 70 at % to 85 at % on the surface side, and the O content is from 60 at % to 70 at % on the substrate side.

Further, in the EUV mask blanks (A) and (B) of the present invention, it is preferred that the light shielding layer contains chromium (Cr), oxygen (O) and nitrogen (N); and in the light shielding layer, the Cr content is from 15 to 40 at %, the total content of O and N is from 60 to 85 at %, and the compositional ratio of O to N is from 9:1 to 5:5.

The light shielding layer may be a film having a gradient composition wherein the O content in the light shielding layer varies gradually in the thickness direction of the light shielding layer so that the O content is high on the surface side, and the O content is low on the substrate side. In a case where the light shielding layer is such a film having a gradient composition, it is preferred that in the light shielding layer, the O content is from 35 at % to 75 at % on the surface side, and the O content is from 25 to 35 at % on the substrate side.

Further, in the EUV mask blanks (A) and (B) of the present invention, it is preferred that the light shielding layer has a two-layer structure comprising an upper layer and a lower layer, wherein:
 the upper layer of the light shielding layer contains chromium (Cr) and oxygen (O); and the Cr content is from 15 to 40 at %, and the O content is from 60 to 85 at %; and
 the lower layer of the light shielding layer contains Cr and nitrogen (N); and the Cr content is from 40 to 97 at %, and the N content is from 3 to 60 at %.

Further, in the EUV mask blanks (A) and (B) of the present invention, it is preferred that the light shielding layer has a two-layer structure comprising an upper layer and a lower layer, wherein:
 the upper layer of the light shielding layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and
 the lower layer of the light shielding layer contains Cr and N; and the Cr content is from 40 to 97 at %, and the N content is from 3 to 60 at %.

Further, in the EUV mask blanks (A) and (B) of the present invention, it is preferred that the light shielding layer has a two-layer structure comprising an upper layer and a lower layer, wherein:
 the upper layer of the light shielding layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and
 the lower layer of the light shielding layer contains chromium (Cr) and oxygen (O); and the Cr content is from 50 to 80 at %, and the O content is from 20 to 50 at %.

Further, in the EUV mask blanks (A) and (B) of the present invention, it is preferred that the light shielding layer has a two-layer structure comprising an upper layer and a lower layer, wherein:
 the upper layer of the light shielding layer contains chromium (Cr) and oxygen (O); and the Cr content is from 15 to 40 at %, and the O content is from 60 to 85 at %; and
 the lower layer of the light shielding layer contains chromium (Cr), oxygen (O) and nitrogen (N); and the Cr content is from 50 to 80 at %, the total content of O and N is from 20 to 50 at %, and the compositional ratio of O to N is from 3:7 to 2:8.

Further, in the EUV mask blanks (A) and (B) of the present invention, in a case where the light shielding layer has such a two-layer structure, it is preferred that at least one of the upper layer and the lower layer is further divided into two or more layers.

Further, in the EUV mask blanks (A) and (B) of the present invention, in a case where the light shielding layer has such a two-layer structure, an interlayer may be present between the upper layer and the lower layer.

Further, in the EUV mask blanks (A) and (B) of the present invention, the light shielding layer may have a multilayer structure having at least 3 layers, wherein a first layer and a second layer which are alternately stacked from the absorber layer side, wherein:
 each of the first layer and the second layer is selected from the group consisting of a film containing chromium (Cr) and oxygen (O), a film containing chromium (Cr) and nitrogen (N) and a film containing chromium (Cr), oxygen (O) and nitrogen (N), provided that the film compositions of the first layer and the second layer are different from each other.
 In the multilayer structure, it is preferred that:
 the first layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and
 the second layer contains Cr and nitrogen (N); and the Cr content is from 40 to 97 at %, and the N content is from 3 to 60 at %.

Further, the multilayer structure is preferably such that the number of layers constituted by stacking the first layer and the second layer is within the range of from 3 to 20.

Further, in the multilayer structure, an interlayer may be present between the first layer and the second layer.

Further, in the EUV mask blanks (A) and (B) of the present invention, the thickness of the light shielding layer is preferably from 10 to 100 nm.

In a case where the light shielding layer has the above two-layer structure, it is preferred that the thickness of the upper layer is from 5 to 80 nm, the thickness of the lower layer is from 5 to 80 nm, and the total thickness of the upper layer and the lower layer is from 10 to 100 nm.

Further, in a case where the light shielding layer has the above multilayer structure, the total thickness of the multilayer structure is preferably from 10 to 100 nm.

Further, in the EUV mask blanks (A) and (B) of the present invention, the absorber layer is preferably composed mainly of tantalum (Ta).

Further, in the EUV mask blanks (A) and (B) of the present invention, the thickness of the absorber layer is preferably from 20 to 90 nm.

Further, in the EUV mask blank (B) of the present invention, the low reflective layer is preferably composed mainly of tantalum (Ta) and oxygen (O).

Further, in the EUV mask blank (B) of the present invention, it is preferred that the thickness of the low reflective layer is from 2 to 10 nm, and the total thickness of the low reflective layer and the absorber layer is from 30 to 90 nm.

In the EUV mask blank (A) of the present invention, the absorber layer may be a layer such that the phase of the EUV light reflected from the surface of the absorber layer is different from the phase of the EUV light reflected from the reflective layer by from 175 to 185 degrees.

In the EUV mask blank (B) of the present invention, the low reflective layer may be a low reflective layer such that the phase of the EUV light reflected from the surface of the low reflective layer is different from the phase of the EUV light reflected from the reflective layer by from 175 to 185 degrees.

Advantageous Effects of Invention

In the EUV mask of the present invention, a light shielding layer is provided outside a mask pattern region, whereby it is possible to reduce reflected light from the region outside the mask pattern region, specifically, a reflected light within a wavelength range of EUV light and a reflected light within a wavelength range of DUV-Vis light.

It is thereby possible to reduce unnecessary exposure of resist formed on a substrate to reflected light from the region outside the mask pattern region.

In the mask pattern region, the thickness of the absorber layer can be reduced by using the principle of phase shift. Accordingly, it is possible to miniaturize a pattern, and a transfer pattern formed in a resist formed on a substrate by using such an EUV mask is excellent in the form accuracy and the dimension accuracy.

The EUV mask of the present invention may be obtained from the EUV mask blank of the present invention.

DETAILED DESCRIPTION OF INVENTION

Now, the EUV mask blank and EUV mask of the present invention will be described with reference to drawings.

Figure 1:
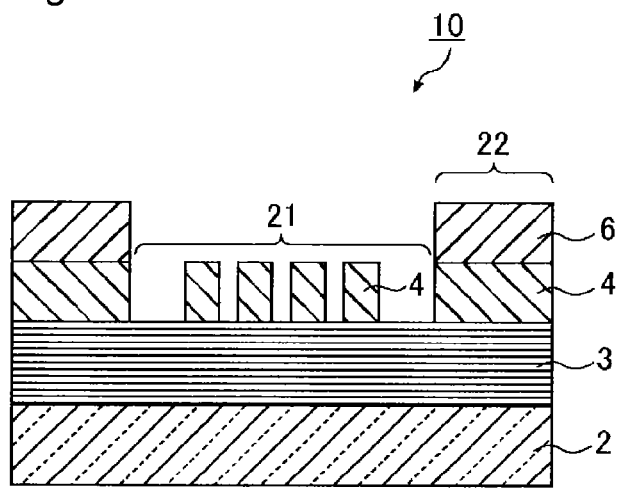
FIG. 1 is a schematic cross-sectional view illustrating an embodiment of the EUV mask (A) of the present invention.

FIG. 1 is a schematic cross-sectional view illustrating an example of an embodiment of the EUV mask (A) of the present invention. An EUV mask 10 shown in FIG. 1 has a mask pattern region 21 and a region 22 outside the mask pattern region 21 on a substrate 2.

The mask pattern region 21 is a region having a mask pattern and to be used for transferring the pattern at the time of EUVL. The EUV mask 10 shown in FIG. 1 has a reflective layer 3 for reflecting EUV light in the mask pattern region 21 on the substrate 2, and on the reflective layer 3, a portion having an absorber layer 4 for absorbing EUV light and a portion having no absorber layer 4 are present. The portion having the absorber layer 4 and the portion having no absorber layer 4 are arranged to form a desired mask pattern.

Meanwhile, the EUV mask 10 shown in FIG. 1 has, in the region 22 outside the mask pattern region, a reflective layer 3 for reflecting EUV light, an absorber layer 4 for absorbing EUV light and a light shielding layer 6 for suppressing reflection of EUV light and DUV-Vis light formed in this order on the substrate 2. The absorber layer 4 in the region 22 outside the mask pattern region and the absorber layer 4 in the mask pattern region 21 constitute a layer in the stage of an EUV mask blank before forming a mask pattern. In short, in the region 22 outside the mask pattern region, the EUV mask (A) of the present invention further has a light shielding layer 6 in addition to the construction of the absorber layer 4 and the lower components (substrate 2, reflective layer 3 and absorber layer 4) in the mask pattern region 21.

By such a construction, the EUV mask (A) of the present invention has an extremely low reflectivity for EUV light reflected from the surface of the light shielding layer 6 in the region 22 outside the mask pattern region as compared with the reflectivity for EUV light reflected from the surface of the absorber layer 4 present in the mask pattern region 21. Specifically, the average EUV reflectivity at a wavelength range of from 13.3 to 13.7 nm from the surface of the light shielding layer 6 is less than 0.5%. Further, the reflectivity for EUV-Vis reflection light from the surface of the light shielding layer 6 in the region 22 outside the mask pattern region becomes also low. Specifically, the reflectivity against DUV-Vis light having a wavelength of from 190 to 500 nm becomes also low, and the reflectivity is at most 30%.

As described above, the thickness of the absorber layer is required to be reduced. On the other hand, when the absorber layer is thinned, reflected light is generated to some extent from the surface of the absorber layer at the time of irradiation of the EUV mask with EUV light. In the case of the EUV mask (A) of the present invention, the average EUV reflectivity at a wavelength range of from 13.3 to 13.7 nm from the surface of the absorber layer is from 0.5 to 15%.

When the average EUV reflectivity from the surface of the absorber layer is within a range of at least 0.5% and less than 2%, the reflection contrast between the surface of the reflective layer and the surface of the absorber layer may be sufficiently maintained. Further, even when the average EUV reflectivity from the surface of the absorber layer is from 2 to 15%, in the mask pattern region of the EUV mask, the reflection contrast between the surface of the reflective layer and the surface of the absorber layer may be sufficiently maintained by using the principle of phase shift.

However, in the region outside the mask pattern region, the effect by phase shift from the light reflected from the reflective layer may not be sufficiently obtained, and a problem may arise such that a resist on a semiconductor wafer such as a Si substrate is exposed to EUV light reflected from the surface of the absorber layer in the region outside the mask pattern region.

Further, as described above, since light from an EUV light source contains not only a light having a wavelength within the EUV region but also a light having a wavelength within the DUV-Vis region, a problem may arise such that a resist on a Si substrate is exposed to DUV-Vis light reflected from the surface of the absorber layer in the region outside the mask pattern region. Since the absorber layer of the EUV mask is, as described later, composed of a material having a high extinction coefficient for EUV light, the reflectivity for EUV light reflected from the surface of the absorber layer can be reduced; however, it does not have an effect to reduce reflectivity for DUV-Vis light reflected from the surface of the absorber layer. Thus, even in a case where the average EUV reflectivity from the surface of the absorber layer is at least 0.5% and less than 2%, and the reflection contrast between the surface of the reflective layer and the surface of the absorber layer may be sufficiently maintained without using the principle of phase shift, a problem may arise such that a resist on a Si substrate is exposed to DUV-Vis light reflected from the surface of the absorber layer in the region outside the mask pattern region.

In the EUV mask (A) of the present invention, the light shielding layer 6 is provide in the region 22 outside the mask pattern region 21, whereby it is possible to reduce the reflectivity for EUV light and the reflectivity for DUV-Vis light reflected from the region 22 outside the mask pattern region 21 while the thickness of the absorber layer 4 in the mask pattern region 21 is reduced. Accordingly, the above problem by EUV reflection light and DUV-Vis reflection light from the region outside the mask pattern region may be reduced at the time of EUV lithography.

Now, constituents of the EUV mask (A) will be described. Here, for convenience of explanation, as reference numerals representing constituents of the EUV mask, ones used for the EUV mask 10 shown in FIG. 1 are used. Here, the following descriptions of the substrate 2, reflective layer 3, protective layer and absorber layer 4 are applicable not only to the EUV mask (A) but also equally to the EUV mask (B) which will be described later.

The substrate 2 is required to satisfy characteristics as a substrate for an EUV mask.

Accordingly, the substrate 2 preferably has a low thermal expansion coefficient (specifically, the thermal expansion coefficient at 20° C. is preferably $0\pm0.05\times10^{-7}$/° C., particularly preferably $0\pm0.03\times10^{-7}$/° C.), and is preferably excellent in the smoothness, the flatness and the durability against a cleaning fluid to be used for cleaning of the EUV mask or an EUV mask blank before forming a mask pattern in the absorber layer. As the substrate 2, specifically, a glass having a low thermal expansion coefficient, such as a $SiO_2$—$TiO_2$ type glass is employed, but the substrate 2 is not limited thereto, and a substrate of crystallized glass obtained by precipitation of a β quartz solid solution, quartz glass, silicon or a metal may also be employed.

The substrate 2 preferably has a smooth surface having a surface roughness (rms) of at most 0.15 nm according to JIS-B0601 and a flatness of at most 100 nm, for the purpose of obtaining a high reflectivity and a high transfer accuracy in an EUV mask.

The size, the thickness, etc. of the substrate 2 is appropriately determined depending on the design values of the EUV mask, and for example, the external size is about 6 inch (152 mm) square and the thickness is about 0.25 inch (6.3 mm).

It is preferred that no defect is present on a film-deposition plane (a plane on which the reflective layer is to be deposited) of the substrate 2. However, even if defects are present, in order to prevent formation of phase defects due to concave defects and/or convex defects, the depth of such concave defects and the height of such convex defects are preferably at most 2 nm, and the half width of such concave defects and convex defects is preferably at most 60 nm.

The reflective layer 3 is not particularly limited so long as it has a desired characteristics as a reflective layer of an EUV mask. Here, the characteristics particularly required for the reflective layer 3 is a high reflectivity for EUV light reflected from the surface of the reflective layer. Specifically, the maximum value of the EUV reflectivity at a wavelength of 13.53 nm from the surface of the reflective layer 3 is preferably at least 60%, more preferably at least 65%. Further, even in a case where a protective layer or a low reflective layer is provided on the reflective layer 3, the maximum value of the EUV reflectivity at a wavelength of 13.53 nm is preferably at least 60%, more preferably at least 65%.

As the reflective layer 3, a multilayer reflective film having a plurality of high refractive index layers and low refractive index layers alternately stacked is usually employed with a view to achieving high reflectivity for EUV reflected light. In the multilayer reflective film composing the reflective layer 3, Si is widely used for the high refractive index layers, and Mo is widely used for the low refractive index layers. Namely, a Mo/Si multilayer reflective film is the most common. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film or a Si/Ru/Mo/Ru multilayer reflective film may also be employed.

The film thickness of each layer and the number of repeating units of the layers constituting the multilayer reflective film composing the reflective layer 3, can be appropriately selected according to the film material to be used and the EUV light reflectivity required for the reflective layer. In a case of Mo/Si reflective film, for example, a reflective layer having a maximum value of EUV reflectivity at a wavelength of 13.53 nm of at least 60% can be obtained by depositing a multilayer reflective film wherein a Mo layer having a thickness of 2.3±0.1 nm and a Si layer having a thickness of 4.5±0.1 nm are alternately stacked so that the number of repeating units becomes from 30 to 60.

Here, layers constituting the multilayer reflective film composing the reflective layer 3 may be each film-formed by a known film-deposition method such as a magnetron sputtering method or an ion beam sputtering method so as to have a desired thickness. For example, in a case of depositing a Mo/Si multilayer reflective film by using an ion beam sputtering method, it is preferred that a Si film is deposited by using a Si target as a target and Ar gas (gas pressure: $1.3\times10^{-2}$ Pa to $2.7\times10^{-2}$ Pa) as a sputtering gas under an ion acceleration voltage of from 300 to 1,500 V at a film-deposition speed of from 1.8 to 18 nm/min to have a thickness of 4.5 nm, and subsequently a Mo film is deposited by using a Mo target as a target and Ar gas (gas pressure: $1.3\times10^{-2}$ Pa to $2.7\times10^{-2}$ Pa) as a sputtering gas under an ion acceleration voltage of from 300 to 1,500 V at a film-deposition speed of from 1.8 to 18 nm/min so as to have a thickness of 2.3 nm. Taking the above process as one cycle, from 30 to 60 cycles of deposition of a Si film and a Mo film are carried out to form a Mo/Si multilayer reflective film. Here, the Si target is preferably a Si target doped with B in terms of electric conductivity.

In order to prevent oxidization of a surface of the reflective layer 3, the uppermost layer of the multilayer reflective film composing the reflective layer 3 is preferably a layer made of a material hard to be oxidized. The layer made of a material hard to be oxidized functions as a cap layer of the reflective layer 3. As a specific example of the layer made of a material hard to be oxidized functioning as a cap layer, a Si layer may be mentioned. When the multilayer reflective film composing the reflective layer 3 is a Mo/Si film, by providing a Si layer as the uppermost layer, it is possible to allow the uppermost layer to function as a cap layer. In this case, the film thickness of the cap layer is preferably 11±2 nm.

Further, a protective layer may be formed between the reflective layer 3 and the absorber layer 4. The protective layer is provided for the purpose of protecting the reflective layer 3 so that the reflective layer 3 is not damaged by etching at the time of forming a mask pattern in the absorber layer 4 by etching (usually dry etching). Accordingly, as the material of the protective layer, a material that is less susceptible to etching of the absorber layer 4, that is, a material having an etching rate lower than that of the absorber layer 4 and being hard to be damaged by the etching. As a material satisfying such a condition, Cr, Al, Ta and nitrides thereof, Ru and Ru compounds (RuB, RuSi, etc.), and $SiO_2$, $Si_3N_4$, $Al_2O_3$ and a mixture thereof may, for example, be mentioned. Among them, Ru and Ru compounds (RuB, RuSi, etc.), CrN and $SiO_2$ are preferred, and Ru and Ru compounds (RuB, RuSi, etc.) are particularly preferred.

Further, in a case of providing the protective layer, the thickness is preferably from 1 to 60 nm, more preferably from 1 to 40 nm.

In a case of providing the protective layer, the protective layer is formed by using a known film-deposition method such as a magnetron sputtering method or an ion beam sputtering method. In a case of depositing Ru film by a magnetron sputtering method, the film is preferably deposited by using a Ru target as a target and Ar gas (gas pressure: $1.0\times10^{-2}$ Pa to $10\times10^{-1}$ Pa) as a sputtering gas under an input power of from 30 to 1,500 V at a film-deposition speed of from 1.2 to 60 nm/min so as to have a thickness of from 2 to 5 nm.

The characteristics particularly required for the absorber layer 4 is a sufficiently high contrast of EUV reflected light in relation to the reflective layer 3 (a protective layer when the protective layer is formed on the reflective layer 3. The same applies hereinafter). In order to achieve the above characteristics, it is preferred that the reflectivity for EUV reflected light from a surface of the absorber layer 4 is extremely low. However, since the thickness of the absorber layer 4 is required to be thin as described above, when it is difficult to sufficiently increase the contrast of EUV reflected light simply by lowering the reflectivity for EUV reflected light from the surface of the absorber layer 4, the contrast of EUV reflected light may be sufficiently increased by using the principle of phase shift in relation between light reflected from the absorber layer 4 and light reflected from the reflective layer 3.

As described above, the reflectivity for EUV reflected light from the surface of the absorber layer 4 is from 0.5 to 15%.

When the average EUV reflectivity of the surface of the absorber layer is from 2 to 15%, the phase difference between the EUV light reflected from the absorber layer 4 and the EUV light reflected from the reflective layer 3 is preferably from 175 to 185 degrees with a view to sufficiently increasing the contrast of EUV reflected light by using the principle of phase shift.

On the other hand, when the average EUV reflectivity of the surface of the absorber layer is within a range of at least 0.5% and less than 2%, it is possible to sufficiently increase the contrast of EUV reflected light without using the principle of phase shift. In such a case, the phase difference is not required to be provided between the EUV light reflected from the absorber layer 4 and the EUV light reflected from the reflective layer 3.

In order to achieve the above characteristic, the absorber layer 4 is made of a material having a high extinction coefficient of EUV light. As the material having a high extinction coefficient of EUV light, a material containing tantalum (Ta) as the main component is preferred. In this specification, a material containing tantalum (Ta) as the main component means a material containing Ta in an amount of at least 40 at % therein. The absorber layer 4 preferably contains tantalum (Ta) in an amount of at least 50 at %, more preferably at least 55 at %.

The material containing Ta as the main component to be used for the absorber layer 4 preferably contains, in addition to Ta, at least one component selected from the group consisting of hafnium (Hf), silicon (Si), zirconium (Zr), germanium (Ge), boron (B), palladium (Pd), hydrogen (H) and nitrogen (N). A specific example of the material containing the above element other than Ta may, for example, be TaN, TaNH, TaHf, TaHfN, TaBSi, TaBSiN, TaB, TaBN, TaSi, TaSiN, TaGe, TaGeN, TaZr, TaZrN, TaPd or TaPdN.

Further, the thickness of the absorber layer 4 is preferably from 20 to 90 nm, more preferably from 30 to 90 nm.

When the thickness of the absorber layer 4 is at least 20 nm and less than 65 nm, it is preferred to sufficiently increase contrast of EUV reflected light by using the principle of phase shift.

When the contrast of EUV reflected light is sufficiently increased by using the principle of phase shift, the thickness of the absorber layer 4 is selected so that the phase difference between the EUV light reflected from the absorber layer 4 and the EUV light reflected from the reflective layer 3 becomes from 175 to 185 degrees.

When the thickness of the absorber layer 4 is at least 65 nm and at most 90 nm, the EUV reflectivity of the surface of the absorber layer is sufficiently low, and thus the contrast of EUV reflected light may be sufficiently increased without using the principle of phase shift.

The absorber layer 4 having the above construction may be formed by a known film-forming method such as a magnetron sputtering method or an ion beam sputtering method.

For example, in a case of forming a TaNH film as the absorber layer 4 by using a magnetron sputtering method, film forming is preferably carried out by using a Ta target as a target, and a mixed gas of Ar, $N_2$ and $H_2$ ($H_2$ gas concentration: 1 to 30 vol %, $N_2$ gas concentration: 5 to 75 vol %, Ar gas concentration: 10 to 94 vol %, gas pressure: $0.5\times10^{-1}$ Pa to 1.0 Pa) as a sputtering gas with an input power of from 300 to 2,000 W at a film-deposition speed of from 0.5 to 60 nm/min to form a film having a thickness of from 20 to 90 nm.

As described above, in the EUV mask (A) of the present invention (EUV mask 10 shown in FIG. 1), in the stage of an EUV mask blank before forming a mask pattern, the absorber layer 4 formed in the region 22 outside the mask pattern region and the absorber layer 4 in the mask pattern region 21 constitute one layer. Accordingly, with regard to the absorber layer 4 formed in the region 22 outside the mask pattern region, the above description about the absorber layer 4 in the mask pattern region 21 may be equally applicable.

The characteristics required for the light shielding layer 6 are that in the region 22 outside the mask pattern region, the average EUV reflectivity at a wavelength range of from 13.3 to 13.7 nm from the surface of the light shielding layer 6 is less than 0.5%, and the DUV-Vis reflectivity at a wavelength of from 190 to 500 nm is at most 30%. However, in the EUV mask (A) of the present invention, it is sufficient that the entire layer structure comprising the absorber layer 4 and the light shielding layer 6 achieves the above reflectivities.

In order to satisfy the low reflective characteristics for EUV light between the above characteristics, the light shielding layer 6 is preferably composed of a material having a large absorption of EUV light. On the other hand, in order to satisfy the low reflective characteristics for DUV-Vis light, it is preferably composed of a material which is transparent (having small absorption) within the wavelength range of DUV-Vis light (190 to 500 nm).

An example of a construction of the light shielding layer 6 satisfying the above characteristics is a CrO film containing chromium (Cr) and oxygen (O), and in the CrO film, the Cr content is from 15 to 40 at %, and the O content is from 60 to 85 at %.

If the Cr content is less than 15 at % (that is, the O content is more than 85 at %), the absorption for EUV light is small, and the average EUV reflectivity will not become less than 0.5%. On the other hand, if the Cr content excesses 40 at % (that is, the O content is less than 60 at %), the absorption for DUV-Vis light is too large to obtain the low reflective characteristics, and thus the DUV-Vis reflectivity will not become 30% or less.

In the above described example of a construction (CrO film) of the light shielding layer 6, it is preferred that the Cr content is from 15 to 35 at %, and the O content is from 65 to 85 at %, more preferred that the Cr content is from 15 to 30 at %, and the O content is from 70 to 85 at %.

The above described example of a construction (CrO film) of the light shielding layer 6, may be a film having a gradient composition wherein the O content in the light shielding layer 6 varies in the thickness direction of the light shielding layer 6 so that the O content is high on the surface side, and the O content is low on the side of the substrate 2. The above film having a gradient composition may be such that the O content in the light shielding layer 6 continuously varies in the thickness direction of the light shielding layer 6, or it may be one having a plurality of layers having different O contents stacked.

In the case where the example of a construction of the light shielding layer 6 is a film having a gradient composition, it is preferred that on the surface side, the O content is from 70 at % to 85 at %, and the Cr content is from 15 at % to 30 at %, and on the side of the substrate 2, the O content is from 60 at % to 70 at %, and the Cr content is from 30 at % to 40 at %.

Further, in the case where the above example of a construction (CrO film) of the light shielding layer 6 is a film having a gradient composition, the average content of Cr and the average content of O in the light shielding layer 6 satisfy the conditions described in the above paragraph.

In the case where the example of a construction (CrO film) of the light shielding layer 6 is a film having a gradient composition, it is more preferred that on the surface side, the O content is from 72 at % to 85 at %, and the Cr content is from 15 at % to 28 at %, and on the side of the substrate 2, the O content is from 62 at % to 70 at %, and the Cr content is from 30 at % to 38 at %, further preferred that on the surface side, the O content is from 75 at % to 85 at %, and the Cr content is from 15 at % to 25 at %, and on the side of the substrate 2, the O content is from 65 at % to 70 at %, and the Cr content is from 30 at % to 35 at %.

Another example of a construction of the light shielding layer 6 satisfying the above characteristics is a CrON film containing Cr, O and nitrogen (N), and in the CrON film, the Cr content is from 15 to 40 at %, the total content of O and N is from 60 to 85 at %, and the compositional ratio of O to N is from 9:1 to 5:5.

If the Cr content is less than 15 at % (that is, the total content of O and N is more than 85 at %), the absorption for EUV light is small, and the average EUV reflectivity will not become less than 0.5%. On the other hand, if the Cr content excesses 40 at % (that is, the total content of O and N is less than 60 at %), the absorption for DUV-Vis light is too large to obtain the low reflective characteristics, and thus the DUV-Vis reflectivity will not become 30% or less.

Further, if the compositional ratio of O is higher than 9:1, improvement of the smoothness by inclusion of N may not be expected. On the other hand, the compositional ratio of N is higher than 5:5, the absorption of DUV-Vis light is too large to obtain the low reflective characteristic, and thus the DUV-Vis reflectivity will not become 30% or less. Further, in a case of forming a CrON film by a sputtering method according to the process as described later, it is difficult to form a film having a higher compositional ratio of N than 5:5.

In the above described example of a construction (CrON film) of the light shielding layer 6, it is preferred that the Cr content is from 15 to 35 at %, the total content of O and N is from 65 to 85 at %, and the compositional ratio of O to N is from 9:1 to 5:5, more preferred that the Cr content is from 15 to 30 at %, the total content of O and N is from 70 to 85 at %, and the compositional ratio of O to N is from 9:1 to 5:5.

The above described example of a construction (CrON film) of the light shielding layer 6, may be a film having a gradient composition wherein the O content in the light shielding layer 6 varies in the thickness direction of the light shielding layer 6 so that the O content is high on the surface side, and the O content is low on the side of the substrate 2. The above film having a gradient composition may be such that the O content in the light shielding layer 6 continuously varies in the thickness direction of the light shielding layer 6, or it may be one having a plurality of layers having different O contents stacked.

In the case where the above example of a construction (CrON film) of the light shielding layer 6 is a film having a gradient composition, it is preferred that the O content is from 35 at % to 75 at % on the surface side, and the O content is from 25 at % to 35 at % on the side of the substrate 2. Further, it is preferred that on the surface side, the Cr content is from 15 at % to 30 at %, the total content of O and N is from 70 at % to 85 at %, and the compositional ratio of O to N is from 9:1 to 5:5, and on the side of the substrate 2, the Cr content is from 30 at % to 40 at %, the total content of O and N is from 60 at % to 70 at %, and the compositional ratio of O to N is from 5:5 to 4:6.

Further, in a case where the above example of a construction (CrON film) of the light shielding layer 6 is a film having a gradient composition, the average content of Cr and the average total content of O and N in the light shielding layer 6 satisfy the conditions described in the above paragraph.

In a case where the above example of a construction (CrON film) of the light shielding layer 6 is a film having a gradient composition, it is more preferred that the O content is from 36 at % to 75 at % on the surface side, and the O content is from 25 at % to 33 at % on the side of the substrate 2. Further, it is more preferred that on the surface side, the Cr content is from 15 at % to 28 at %, the total content of O and N is from 72 at % to 85 at %, and the compositional ratio of O to N is from 9:1 to 5:5, and on the side of the substrate 2, the Cr content is from 33 at % to 40 at %, the total content of O and N is from 60 at % to 67 at %, and the compositional ratio of O to N is from 5:5 to 4:6. It is furthermore preferred that the O content is from 38 at % to 75 at % on the surface side, and the O content is from 25 at % to 32 at % at the side of the substrate 2. Further, it is furthermore preferred that on the surface side, Cr content is from 15 at % to 25 at %, the total content of O and N is from 75 at % to 85 at %, and the compositional ratio of O to N is from 9:1 to 5:5, and on the side of the substrate 2, the Cr content is from 35 at % to 40 at %, the total content of O and N is from 60 at % to 65 at %, and the compositional ratio of O to N is from 5:5 to 4:6.

Another example of a construction of the light shielding layer 6 satisfying the above characteristics has a two-layer structure comprising an upper layer and a lower layer, wherein the upper layer of the light shielding layer 6 is a CrO film containing Cr and O, and in the upper layer (CrO film) of the light shielding layer 6, the Cr content is from 15 to 40 at %, and the O content is from 60 to 85 at %; and the lower layer of the light shielding layer 6 is a CrN film containing Cr and N, and in the lower layer (CrN film) of the light shielding layer 6, the Cr content is from 40 to 97 at %, and the N content is from 3 to 60 at %.

In the upper layer (CrO film) of the light shielding layer 6, if the Cr content is less than 15 at % (that is, the O content is more than 85 at %), the absorption for EUV light is small, and the average EUV reflectivity will not become less than 0.5%. On the other hand, if the Cr content excesses 40 at % (that is, the O content is less than 60 at %), the absorption for DUV-Vis light is too large to obtain the low reflective characteristics, and thus the DUV-Vis reflectivity will not become 30% or less.

In the lower layer (CrN film) of the light shielding layer 6, if the Cr content is less than 40 at % (that is, the N content excesses 60 at %), the absorption of EUV light is small, and the average EUV reflectivity will not become less than 0.5%. On the other hand, if the Cr content excesses 97 at % (that is, N is less than 3 at %), there may be problems such as crystallization and increase in stress.

In the above example of a construction (CrO film/CrN film) of the light shielding layer 6 having a two-layer structure, it is preferred that in the upper layer (CrO film) of the light shielding layer 6, the Cr content is from 15 to 35 at %, and the O content is from 65 to 85 at %, more preferred that the Cr content is from 15 to 30 at %, and the O content is from 70 to 85 at %. On the other hand, in the lower layer (CrN film) of the light shielding layer 6, it is preferred that the Cr content is from 40 to 95 at %, and the N is from 5 to 60 at %, more preferred that the Cr content is from 40 to 90 at %, and N is from 10 to 60 at %.

Another example of a construction of the light shielding layer 6 satisfying the above characteristics has a two-layer structure comprising an upper layer and a lower layer, wherein the upper layer of the light shielding layer 6 is a CrON film containing Cr, O and N, and in the upper layer (CrON film) of the light shielding layer 6, the Cr content is from 15 to 40 at %, the total content of O and N is from 60 to 85 at %, and the compositional ratio of O to N is from 9:1 to 5:5; and the lower layer of the light shielding layer 6 is a CrN film containing Cr and N, and in the lower layer (CrN film) of the light shielding layer 6, the Cr content is from 40 to 97 at %, and the N content is from 3 to 60 at %.

In the upper layer (CrON film) of the light shielding layer 6, if the Cr content is less than 15 at % (that is, the total content of O and N is more than 85 at %), the absorption for EUV light is small, and the average EUV reflectivity will not become less than 0.5%. On the other hand, if the Cr content excesses 40 at % (that is, the total content of O and N is less than 60 at %), the absorption for DUV-Vis light is too large to obtain the low reflective characteristics, and thus the DUV-Vis reflectivity will not become 30% or less. Further, if the compositional ratio of O is higher than 9:1, improvement of the smoothness by inclusion of N may not be expected. On the other hand, the compositional ratio of N is higher than 5:5, the absorption of DUV-Vis light is too large to obtain the low reflective characteristic, and thus the DUV-Vis reflectivity will not become 30% or less. Further, in a case of forming a CrON film by a sputtering method according to the process as described later, it is difficult to form a film having a higher compositional ratio of N than 5:5.

In the lower layer (CrN film) of the light shielding layer 6, if the Cr content is less than 40 at % (that is, the N content excesses 60 at %), the absorption of EUV light is small, and the average EUV reflectivity will not become less than 0.5%. On the other hand, if the Cr content excesses 97 at % (that is, N is less than 3 at %), there may be problems such as crystallization and increase in stress.

In the above example of a construction (CrON film/CrN film) of the light shielding layer 6 having a two-layer structure, it is preferred that in the upper layer (CrON film) of the light shielding layer 6, the Cr content is from 15 to 35 at %, and the total content of O and N is from 65 to 85 at %, and the compositional ratio of O to N is from 9:1 to 5:5, more preferred that the Cr content is from 15 to 30 at %, the total content of O and N is from 70 to 85 at %, and the compositional ratio of O to N is from 9:1 to 5:5. On the other hand, in the lower layer (CrN film) of the light shielding layer 6, it is preferred that the Cr content is from 40 to 95 at %, and the N is from 5 to 60 at %, more preferred that the Cr content is from 40 to 90 at %, and N is from 10 to 60 at %.

Another example of a construction of the light shielding layer 6 satisfying the above characteristics has a two-layer structure comprising an upper layer and a lower layer, wherein the upper layer of the light shielding layer 6 is a CrON film containing Cr, O and N, and in the upper layer (CrON film) of the light shielding layer 6, the Cr content is from 15 to 40 at %, the total content of O and N is from 60 to 85 at %, and the compositional ratio of O to N is from 9:1 to 5:5; and the lower layer of the light shielding layer 6 is a CrO film containing Cr and O, and in the lower layer (CrO film) of the light shielding layer 6, the Cr content is from 50 to 80 at %, and the O content is from 20 to 50 at %.

In the upper layer (CrON film) of the light shielding layer 6, if the Cr content is less than 15 at % (that is, the total content of O and N is more than 85 at %), the absorption for EUV light is small, and the average EUV reflectivity will not become less than 0.5%. On the other hand, if the Cr content excesses 40 at % (that is, the total content of O and N is less than 60 at %), the absorption for DUV-Vis light is too large to obtain the low reflective characteristics, and thus the DUV-Vis reflectivity will not become 30% or less. Further, if the compositional ratio of O is higher than 9:1, improvement of the smoothness by inclusion of N may not be expected. On the other hand, the compositional ratio of N is higher than 5:5, the absorption of DUV-Vis light is too large to obtain the low reflective characteristic, and thus the DUV-Vis reflectivity will not become 30% or less. Further, in a case of forming a CrON film by a sputtering method according to the process as described later, it is difficult to form a film having a higher compositional ratio of N than 5:5.

In the lower layer (CrO film) of the light shielding layer 6, if the Cr content is less than 50 at % (that is, the O content excesses 50 at %), the absorption of EUV light is small, and the average EUV reflectivity will not become less than 0.5%. On the other hand, if the Cr content excesses 80 at % (that is, O is less than 20 at %), the absorption of DUV-Vis light is too large to obtain the low reflective characteristic, and thus the DUV-Vis reflectivity will not become 30% or less.

In the above example of a construction (CrON film/CrO film) of the light shielding layer 6 having a two-layer structure, it is preferred that in the upper layer (CrON film) of the light shielding layer 6, the Cr content is from 15 to 35 at %, the total content of O and N is from 65 to 85 at %, and the compositional ratio of O to N is from 9:1 to 5:5, more preferred that the Cr content is from 15 to 30 at %, the total content of O and N is from 70 to 85 at %, and the compositional ratio of O to N is from 9:1 to 5:5. On the other hand, in the lower layer (CrO film) of the light shielding layer 6, it is preferred that the Cr content is from 55 to 80 at %, and the O content is from 20 to 45 at %, more preferred that the Cr content is from 60 to 80 at %, and O content is from 20 to 40 at %.

Another example of a construction of the light shielding layer 6 satisfying the above characteristics has a two-layer structure comprising an upper layer and a lower layer, wherein the upper layer of the light shielding layer 6 is a CrO film containing Cr and O, and in the upper layer (CrO film) of the light shielding layer 6, the Cr content is from 15 to 40 at %, and the O content is from 60 to 85 at %; and the lower layer of the light shielding layer 6 is a CrON film containing Cr, O and N, and in the lower layer (CrON film) of the light shielding layer 6, the Cr content is from 50 to 80 at %, the total content of O and N is from 20 to 50 at %, and the compositional ratio of O to N is from 3:7 to 2:8.

In the upper layer (CrO film) of the light shielding layer 6, if the Cr content is less than 15 at % (that is, the O content is more than 85 at %), the absorption for EUV light is small, and the average EUV reflectivity will not become less than 0.5%. On the other hand, if the Cr content excesses 40 at % (that is, the O content is less than 60 at %), the absorption for DUV-Vis light is too large to obtain the low reflective characteristics, and thus the DUV-Vis reflectivity will not become 30% or less.

In the lower layer (CrON film) of the light shielding layer 6, if the Cr content is less than 50 at % (that is, the total content of O and N is more than 50 at %), the absorption for EUV light is small, and the average EUV reflectivity will not become less than 0.5%. On the other hand, if the Cr content excesses 80 at % (that is, the total content of O and N is less than 20 at %), the absorption for DUV-Vis light is too large to obtain the low reflective characteristics, and thus the DUV-Vis reflectivity will not become 30% or less. Further, if the compositional ratio of O is higher than 3:7, improvement of the smoothness by inclusion of N may not be expected. On the other hand, the compositional ratio of N is higher than 2:8, the absorption of DUV-Vis light is too large to obtain the low reflective characteristic, and thus the DUV-Vis reflectivity will not become 30% or less.

In the above example of a construction (CrO film/CrON film) of the light shielding layer 6 having a two-layer structure, it is preferred that in the upper layer (CrO film) of the light shielding layer 6, the Cr content is from 15 to 35 at %, and the O content is from 65 to 85 at %, more preferred that the Cr content is from 15 to 30 at %, and the O content is from 70 to 85 at %. On the other hand, in the lower layer (CrON film) of the light shielding layer 6, it is preferred that the Cr content is from 55 to 80 at %, the total content of O and N is from 20 to 45 at %, and the compositional ratio of O to N is from 3:7 to 2:8, more preferred that the Cr content is from 60 to 80 at %, the total content of O and N is from 20 to 40 at %, and the compositional ratio of O to N is from 3:7 to 2:8.

In the above described examples of a construction of the light shielding layer 6 having a two-layer structure i.e. (CrO film/CrN film), (CrON film/CrN film), (CrON film/CrO film), and (CrO film/CrON film), at least one of the upper layer and the lower layer may be further divided into two or more layers. As a specific example of a construction wherein at least one of the upper layer and the lower layer is further divided into two or more layers, one having a plurality of layers having different contents of elements constituting the upper layer or the lower layer stacked may be mentioned.

Further, in the above described examples of a construction of the light shielding layer 6 having a two-layer structure i.e. (CrO film/CrN film), (CrON film/CrN film), (CrON film/CrO film), and (CrO film/CrON film), an interlayer may be present between the upper layer and the lower layer. As a specific example of such an interlayer, a layer having an intermediate composition between the upper layer and the lower layer as a result of containing an element diffused from at least one of the upper layer and the lower layer may be mentioned.

The above-described examples of a construction of the light shielding film (CrO film, CrON film), and the upper layer and the lower layer of the above examples of construction of the light shielding layer having a two-layer structure (CrO film, CrON film, CrN film) may contain another element which has no negative effect on the characteristics as a light shielding film. Specific examples of such another element include carbon (C), boron (B) and hydrogen (H). The total content of such elements is preferably at most 7 at %, more preferably at most 5 at %, further preferably at most 3 at %.

Another example of a construction of the light shielding layer 6 satisfying the above characteristics contains a light shielding layer 6 having a multilayer structure having at least 3 layers wherein a first layer and a second layer are alternately stacked. "A multilayer structure having at least 3 layers alternately stacked" means that a first layer and a second layer are alternately stacked to form a construction wherein at least 3 layers in total are stacked. That is, multilayer structures such as first layer/second layer/first layer, first layer/second layer/first layer/second layer and first layer/second layer/first layer/second layer/first layer are contained.

Each of the first layer and the second layer constituting the multilayer structure is selected from the group consisting of a film (CrO film) containing chromium (Cr) and oxygen (O), a film (CrN film) containing chromium (Cr) and nitrogen (N) and a film (CrON film) containing chromium (Cr), oxygen (O) and nitrogen (N), provided that the film compositions of the first layer and the second layer are different from each other. That is, as a combination of the first layer and the second layer, 6 combinations may be selected from these films, and any of these combinations may be selected. The first layer is, in the light shielding layer 6, a layer with which stacking of layers starts i.e. a layer present on the side of the absorber layer 4. As described above, in the light shielding layer 6, the first layer and the second layer are alternately stacked. Accordingly, the second layer is a layer to be stacked on the layer with which stacking of layers starts. Then, they are alternately stacked, that is, a first layer is stacked on a second layer, and a second layer is stacked on a first layer.

Further, the "multilayer structure wherein layers are alternately stacked" is preferably constituted by at most 20 layers in total, more preferably at most 10 layers in total. Further, an interlayer may be present between the first layer and the second layer, and as a specific example of such an interlayer, a layer having an intermediate composition between the first layer and the second layer as a result of inclusion of an element diffused from at least one of the first layer and the second layer, may be mentioned.

Hereinafter, among 6 combinations of the first layer and the second layer constituting the multilayer structure, representative 4 combinations will be described as examples. The combinations other than the 4 combinations are a combination of a CrN film as the first layer and a CrO film as the second layer, and a combination of a CrN film as the first layer and a CrON film as the second layer.

Now, a combination of a CrON film as the first layer and a CrN film as the second layer will be described. In this case, it is preferred that in the first layer (CrON film), the Cr content is from 15 to 40 at %, the total content of O and N is from 60 to 85 at %, and the compositional ratio of O to N is from 9:1 to 5:5, and in the second layer (CrN film), the Cr content is from 40 to 97 at %, and the N content is from 3 to 60 at %.

In the first layer (CrON film), if the Cr content is less than 15 at % (i.e. the total content of O and N excesses 85 at %), the absorption of EUV light is small, and the average EUV reflectivity will not become less than 0.5%. On the other hand, if the Cr content excesses 40 at % (i.e. the total content of O and N is less than 60 at %), the absorption of DUV-Vis light is too large to obtain the low reflective characteristics, and thus the DUV-Vis reflectivity will not become at most 30%. Further, if the compositional ratio of O is higher than 9:1, improvement of the smoothness by inclusion of N may not be expected. On the other hand, if the compositional ratio of N is higher than 5:5, the absorption of DUV-Vis light is too large to obtain the low reflective characteristics, and thus the DUV-Vis reflectivity will not become at most 30%. Further, in the case of forming a CrON film by a sputtering method according to the process described later, it is difficult to form a film having a compositional ratio of N higher than 5:5.

In the second layer (CrN film), if the Cr content is less than 40 at % (i.e. the N content excesses 60 at %), the absorption of EUV light is small, and the average EUV reflectivity will not become less than 0.5%. On the other hand, if the Cr content excesses 97 at % (i.e. N is less than 3 at %), there may be problems such that crystallization and increase in stress.

In the above example of a construction of the multilayer structure, it is preferred that in the first layer (CrON film), the Cr content is from 15 to 35 at %, the total content of O and N is from 65 to 85 at %, and the compositional ratio of O to N is from 9:1 to 5:5, more preferred that the Cr content is from 15 to 30 at %, the total content of O and N is from 70 to 85 at %, and the compositional ratio of O to N is from 9:1 to 5:5. On the other hand, in the second layer (CrN film), it is preferred that Cr content is from 40 to 95 at %, and N is from 5 to 60 at %, more preferred that the Cr content is from 40 to 90 at %, and N is from 10 to 60 at %.

Now, a combination of a CrO film as the first layer and a CrN film as the second layer will be described.

In this case, it is preferred that in the first layer (CrO film), the Cr content is from 15 to 40 at %, and the O content is from 60 to 85 at %, and in the second layer (CrN film), the Cr content is from 40 to 97 at %, and the N content is from 3 to 60 at %.

In the first layer (CrO film), if the Cr content is less than 15 at % (i.e. the O content excesses 85 at %), the absorption of EUV light is small, and the average EUV reflectivity will not become less than 0.5%. On the other hand, if the Cr content excesses 40 at % (i.e. the O content is less than 60 at %), the absorption of DUV-Vis light is too large to obtain the low reflective characteristics, and thus the DUV-Vis reflectivity will not become at most 30%.

In the second layer (CrN film), if the Cr content is less than 40 at % (i.e. the N content excesses 60 at %), the absorption of EUV light is small, and the average EUV reflectivity will not become less than 0.5%. On the other hand, if the Cr content excesses 97 at % (i.e. N is less than 3 at %), there may be problems such that crystallization and increase in stress.

In the above example of a construction of the multilayer structure, it is preferred that in the first layer (CrO film), the Cr content is from 15 to 35 at %, and the O content is from 65 to 85 at %, more preferred that the Cr content is from 15 to 30 at %, and the O content is from 70 to 85 at. On the other hand, in the second layer (CrN film), it is preferred that Cr content is from 40 to 95 at %, and N is from 5 to 60 at %, more preferred that the Cr content is from 40 to 90 at %, and N is from 10 to 60 at %.

Now, a combination of a CrON film as the first layer and a CrO film as the second layer will be described.

In this case, it is preferred that in the first layer (CrON film), the Cr content is from 15 to 40 at %, the total content of O and N is from 60 to 85 at %, and the compositional ratio of O to N is from 9:1 to 5:5, and in the second layer (CrO film), the Cr content is from 50 to 80 at %, and the O content is from 20 to 50 at %.

In the first layer (CrON film), if the Cr content is less than 15 at % (i.e. the total content of O and N excesses 85 at %), the absorption of EUV light is small, and the average EUV reflectivity will not become less than 0.5%. On the other hand, if the Cr content excesses 40 at % (i.e. the total content of O and N is less than 60 at %), the absorption of DUV-Vis light is too large to obtain the low reflective characteristics, and thus the DUV-Vis reflectivity will not become at most 30%. Further, if the compositional ratio of O is higher than 9:1, improvement of the smoothness by inclusion of N may not be expected. On the other hand, if the compositional ratio of N is higher than 5:5, the absorption of the DUV-Vis light is too large to obtain the low reflective characteristics, and thus the DUV-Vis reflectivity will not become at most 30%. Further, in the case of forming a CrON film by a sputtering method according to the process described later, it is difficult to form a film having a compositional ratio of N higher than 5:5.

In the second layer (CrO film), if the Cr content is less than 50 at % (i.e. the O content excesses 50 at %), the absorption of EUV light is small, and the average EUV reflectivity will not become less than 0.5%. On the other hand, if the Cr content excesses 80 at % (i.e. the O content is less than 20 at %), the absorption of the DUV-Vis light is too large to obtain the low reflective characteristics, and thus the DUV-Vis reflectivity will not become at most 30%.

In the above example of a construction of the multilayer structure, it is preferred that in the first layer (CrON film), the Cr content is from 15 to 35 at %, the total content of O and N is from 65 to 85 at %, and the compositional ratio of O to N is from 9:1 to 5:5, more preferred that the Cr content is from 15 to 30 at %, the total content of O and N is from 70 to 85 at %, and the compositional ratio of O to N is from 9:1 to 5:5. On the other hand, in the second layer (CrO film), it is preferred that Cr content is from 55 to 80 at %, and the O content is from 20 to 45 at %, more preferred that the Cr content is from 60 to 80 at %, and the O content is from 20 to 40 at %.

Now, a combination of a CrO film as the first layer and a CrON film as the second layer will be described.

In this case, it is preferred that in the first layer (CrO film), and the Cr content is from 15 to 40 at %, the O content is from 60 to 85 at %, and in the second layer (CrON film), the Cr content is from 50 to 80 at %, the total content of O and N is from 20 to 50 at %, and the compositional ratio of O to N is from 3:7 to 2:8.

In the first layer (CrO film), if the Cr content is less than 15 at % (i.e. the O content excesses 85 at %), the absorption of EUV light is small, and the average EUV reflectivity will not become less than 0.5%. On the other hand, if the Cr content excesses 40 at % (i.e. the O content is less than 60 at %), the absorption of DUV-Vis light is too large to obtain the low reflective characteristics, and thus the DUV-Vis reflectivity will not become at most 30%.

In the second layer (CrON film), if the Cr content is less than 50 at % (i.e. the total content of O and N excesses 50 at %), the absorption of EUV light is small, and the average EUV reflectivity will not become less than 0.5%. On the other hand, if the Cr content excesses 80 at % (i.e. the total content of O and N is less than 20 at %), the absorption of DUV-Vis light is too large to obtain the low reflective characteristics, and thus the DUV-Vis reflectivity will not become at most 30%. Further, if the compositional ratio of O is higher than 3:7, improvement of the smoothness by inclusion of N may not be expected. On the other hand, if the compositional ratio of N is higher than 2:8, the absorption of the DUV-Vis light is too large to obtain the low reflective characteristics, and thus the DUV-Vis reflectivity will not become at most 30%.

In the above example of a construction of the multilayer structure, it is preferred that in the first layer (CrO film), the Cr content is from 15 to 35 at %, and the O content is from 65 to 85 at %, more preferred that the Cr content is from 15 to 30 at %, and the O content is from 70 to 85 at %. On the other hand, in the second layer (CrON film), it is preferred that Cr content is from 55 to 80 at %, the total content of O and N is from 20 to 45 at %, and the compositional ratio of O to N is from 3:7 to 2:8, more preferred that the Cr content is from 60 to 80 at %, the total content of O and N is from 20 to 40 at %, and the compositional ratio of O to N is from 3:7 to 2:8.

The thickness of the light shielding layer 6 may be arbitrary selected so that the average EUV reflectivity becomes less than 0.5% by the thickness. However, in order to obtain low reflective characteristics for DUV-Vis light, the thickness of the light shielding layer 6 is preferably within a range of from 10 to 100 nm. If the thickness of the light shielding layer 6 is less than 10 nm, the DUV-Vis reflectivity cannot be at most 30%. On the other hand, if the thickness is at least 100 nm, the pattern accuracy at the time of manufacturing a mask will be deteriorated, and the cost for film formation will be increased due to longer time of film formation.

The thickness of the light shielding layer 6 is preferably from 10 to 95 nm, more preferably from 10 to 90 nm.

In the case of the above examples of a construction of the light shielding layer 6 having a two-layer structure, the total thickness of the upper layer and the lower layer satisfies the condition described in the above paragraph. Under such a condition, the thickness of the upper layer is preferably from 5 to 80 nm, more preferably from 10 to 80 nm, further preferably from 15 to 80 nm. On the other hand, the thickness of the lower layer is preferably from 5 to 80 nm, more preferably from 10 to 80 nm, further preferably from 15 to 80 nm.

Further, in the case where in the above examples of a construction of the light shielding layer 6 having a two-layer structure, when at least one of the upper layer and the lower layer is further divided into two or more layers, the thickness of each divided layer is preferably from 5 to 40 nm, more preferably from 7 to 40 nm, further preferably from 10 to 40 nm.

Further, in the case where in the above examples of a construction of the light shielding layer 6 having a two-layer structure, when an interlayer is present between the upper layer and the lower layer, the thickness of the interlayer is preferably from 5 to 40 nm, more preferably from 7 to 40 nm, further preferably from 10 to 40 nm.

In the case of the above examples of a construction of the light shielding layer 6 having a multilayer structure, each of the thicknesses of the first layer and the second layer may be arbitrary selected so that the average EUV reflectivity becomes less than 0.5%. However, in order to obtain a low reflective characteristics for DUV-Vis light, the total thickness of the multilayer structure is preferably within a range of from 10 to 100 nm. If the total thickness of the multilayer structure is less than 10 nm, the DUV-Vis reflectivity cannot be at most 30%. On the other hand, if it is at least 100 nm, the pattern accuracy at the time of manufacturing a mask will be deteriorated, and the cost for film formation will be increased due to a longer time of film formation.

Further, from a viewpoint of preventing deterioration in the pattern accuracy at the time of manufacturing a mask and increase in the cost for film formation, the total thickness of the absorber layer 4 and the light shielding layer 6 is preferably at most 160 nm, more preferably at most 155 nm.

The reflectivity for DUV-Vis light from the surface of the light shielding layer 6 is preferably at most 27%, more preferably at most 25%.

The light shielding layer 6 having the above construction may be formed by carrying out a publicly known deposition method such as a magnetron sputtering method or an ion beam sputtering method. Below a methods to form a CrO film, a CrON film and a CrN film as the light shielding layer 6 by a magnetron sputtering method will be described.

Figure 2:
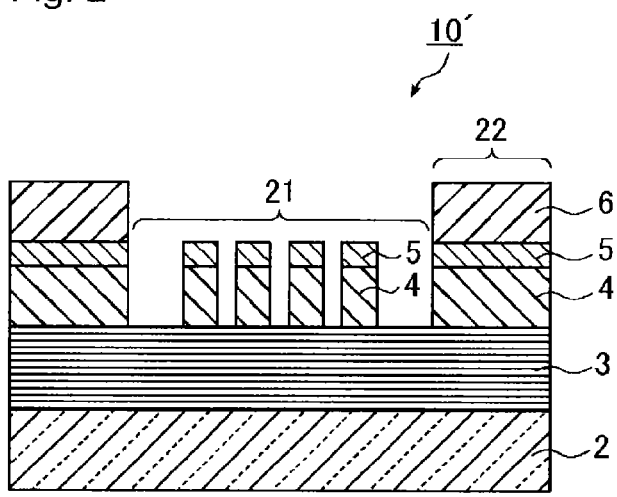
FIG. 2 is a schematic cross-sectional view illustrating an embodiment of the EUV mask (B) of the present invention.

CrO Film
  Target: Cr target
  Sputtering gas: mixed gas of Ar and $O_2$ (Ar gas concentration: 30 to 50 vol %, $O_2$ gas concentration: 50 to 70 vol %, gas pressure: $0.5\times10^{-1}$ Pa to 1.0 Pa)
  Input power: 300 to 2,000 W
  Deposition speed: 0.5 to 60 nm/min
CrON Film
  Target: Cr target
  Sputtering gas: mixed gas of Ar, $N_2$ and $O_2$ (Ar gas concentration: 30 to 50 vol %, $N_2$ gas concentration: 5 to 30 vol %, $O_2$ gas concentration: 20 to 65 vol %, gas pressure: $0.5\times10^{-1}$ Pa to 1.0 Pa)
  Input power: 300 to 2,000 W
  Deposition speed: 0.5 to 60 nm/min
CrN Film
  Target: Cr target
  Sputtering gas: mixed gas of Ar and $N_2$ (Ar gas concentration: 30 to 50 vol %, $N_2$ gas concentration: 50 to 70 vol %, gas pressure: $0.5\times10^{-1}$ Pa to 1.0 Pa)
  Input power: 300 to 2,000 W
  Deposition speed: 0.5 to 60 nm/min The EUV mask of the present invention may have a constituent other than the reflective layer, the absorber layer and the light shielding layer on the substrate. FIG. 2 is a schematic cross-sectional view illustrating an embodiment of the EUV mask (B) of the present invention. In the EUV mask 10' shown in FIG. 2, a low reflective layer 5 for improving the contrast at the time of inspection of a mask pattern (hereinafter referred to as "low reflective layer") is present on the absorber layer 4 in the mask pattern region 21, and a low reflective layer 5 is present between the absorber layer 4 and the light shielding layer 6 in the region 22 outside the mask pattern region. In short, the EUV mask (B) of the present invention has a low reflective layer on the absorber layer of the EUV mask (A) of the present invention. As described above, since the absorber layer 4 in the region 22 outside the mask pattern region and the absorber layer 4 in the mask pattern region 21 constitute a layer in the stage of EUV mask blank before forming a mask pattern, when a low reflective layer is present on the absorber layer, a low reflective layer 5 is present between the absorber layer 4 and the light shielding layer 6 in the region 22 outside the mask pattern region.

Here, to the EUV mask (B), the above descriptions as to the substrate 2, the reflective layer 3, the protective layer and the absorber layer 4 can be applied without modification.

At the time of producing an EUV mask, after a mask pattern is formed in the absorber layer, the mask pattern is inspected to check whether it is formed as designed. In this inspection of mask pattern, an inspection machine using light in the vicinity of 257 nm as inspection light is usually employed. Namely, the mask pattern is inspected by means of the contrast of the reflected light in this wavelength range of about 257 nm. The absorber layer of the EUV mask has an extremely low reflectivity for EUV reflected light and is excellent in the properties as an absorber layer of an EUV mask, but from the viewpoint of the wavelength region of inspection light, it cannot be said that the reflectivity for the reflected light is sufficiently low, and there may be a case where a sufficient contrast is not obtained at the time of inspection of a mask pattern. If a sufficient contrast is not obtained, defects cannot be sufficiently detected at the time of mask pattern inspection, and an accurate defect inspection cannot be performed.

When a low reflective layer for improving the contrast at the time of mask pattern inspection is formed on the absorber layer, the reflectivity for the reflected light generated at the time of irradiation of the surface of the low reflective layer with an inspection light for a mask pattern becomes extremely low, whereby the contrast at the time of mask pattern inspection is improved. Specifically, in the case of using a light of about 257 nm, the reflectivity for the reflected light generated at the time of irradiation of the surface of the low reflective layer 5 with an inspection light for a mask pattern is preferably at most 15%.

The low reflective layer 5 is preferably made of a material having a refractive index lower than that of the absorber layer 4 at the wavelength of the inspection light in order to achieve the above characteristic.

The low reflective layer 5 is preferably made of a material containing tantalum (Ta) and oxygen (O) as the main components. The material of the low reflective layer 5 containing Ta and O as the main components contains, in addition to Ta and O, at least one component selected from hafnium (Hf), germanium (Ge), silicon (Si), boron (B), nitrogen (N) and hydrogen (H).

Specific examples of the material containing the above element other than Ta include TaO, TaON, TaONH, TaHfO, TaHfON, TaBNO, TaBSiO and TaBSiON.

The light of about 257 nm used as an inspection light for a mask pattern is within the wavelength range (190 to 500 nm) of DUV-Vis light. However, in a case of a low reflective layer 5 containing Ta and O as the main components as described above, the low reflective characteristics may not be provided in the entire region of the wavelength range (190 to 500 nm) of DUV-Vis light. Such a point is clear from FIG. 8.

Figure 8:
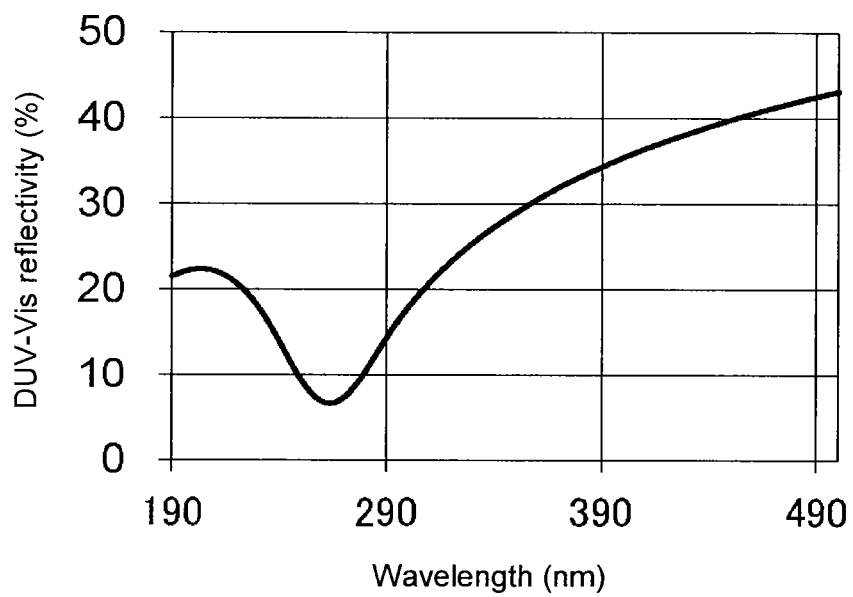
FIG. 8 is a graph showing a reflection characteristic of a TaON film against DUV-Vis light.

FIG. 8 is a graph showing the relation between the reflectivity (DUV-Vis reflectivity (%)) and the wavelength (nm) of the DUV-Vis reflected light at the time of irradiation of the surface of TaON film with DUV-Vis light. The TaON film has a thickness of 7 nm. The reflectivity for DUV-Vis light reflected from the surface of the TaON film was measured at an incident angle of 5 degrees by using a spectrophotometer (UV-4100 (manufactured by Hitachi High-technologies Corporation)).

In the EUV mask (B) of the present invention, it is preferred that in the mask pattern region 21, the total thickness of the absorber layer 4 and the low reflective layer 5 is within the range of thickness of the absorber layer 4 of the above-described EUV mask (A) of the present invention. However, since the EUV light absorber characteristics in the absorber layer 4 may be reduced if the thickness of the low reflective layer 5 is larger than the thickness of the absorber layer 4, the thickness of the low reflective layer 5 is preferably thinner than the thickness of the absorber layer. Thus, the thickness of the low reflective layer 5 is preferably from 2 to 10 nm.

The low reflective layer 5 may be formed by carrying out a publicly known film-forming method such as a magnetron sputtering method or an ion beam sputtering method.

For example, when a TaON film is formed as the low reflective layer 5 by using a magnetron sputtering method, it is preferred that the film is deposited by using a Ta target as a target and a mixed gas of Ar, $N_2$ and $O_2$ (Ar gas concentration: 30 to 50 vol %, $N_2$ gas concentration: 5 to 30 vol %, Ar gas concentration: 20 to 65 vol %, gas pressure: $0.5 \times 10^{-1}$ Pa to 1.0 Pa) as a sputtering gas with an input power of from 300 to 2,000 W at a deposition speed of from 0.5 to 60 nm/min.

The EUV mask (B) of the present invention is required to satisfy the characteristics demanded for the above-described EUV mask (A) of the present invention except that the reflectivity for the reflected light generated at the time of irradiation of the surface of the low reflective layer 5 with an inspection light for a mask pattern is at most 15%.

For example, in the mask pattern region 21, the total thickness of the absorber layer 4 and the low reflective layer 5 is preferably within a range of from 30 to 90 nm, and in a case of sufficiently improving the contrast of EUV reflected light by using the principle of phase shift, the total thickness of the absorber layer 4 and the low reflective layer 5 is selected so that the phase difference between the EUV light reflected from the low reflective layer 5 and the EUV light reflected from the reflective layer 3 becomes from 175 to 185 degrees.

Further, in the EUV mask (B) of the present invention, the total thickness of the absorber layer 4, the low reflective layer 5 and the light shielding layer 6 is preferably within the range of the total thickness of the absorber layer 4 and the light shielding layer 5 of the above-described EUV mask (A) of the present invention.

Further, in the region 22 outside the mask pattern region, the average EUV reflectivity for EUV reflected light at a wavelength range of from 13.3 to 13.7 nm from the surface of the light shielding layer 6 is less than 0.5% and the DUV-Vis reflectivity at a wavelength of from 190 to 500 nm is at most 30%. However, it is sufficient when the EUV mask (B) of the present invention achieves the above reflectivity by the entire layer structure including the absorber layer 4, the low reflective layer 5 and the light shielding layer 6.

Further, the EUV mask of the present invention may have a functional film known in the field of EUV mask in addition to the above-described construction, that is, the reflective layer, the protective layer, the absorber layer, the light shielding layer and the low reflective layer. A specific example of such a functional film may be a dielectric coating applied on a rear surface of the substrate for facilitating electrostatic chucking of the substrate as described in JP-A-2003-501823. Here, the rear surface of the substrate means a surface of the substrate of the EUV mask opposite to the surface on which the reflective layer is formed.

The electrical conductivity of a constituent material and the thickness of the dielectric coating to be applied on the rear surface of the substrate for such a purpose, are selected so that the sheet resistance will be at most 100Ω/□. The constituent material of the dielectric coating may be selected from a wide range of materials described in known literature. For example, a dielectric coating as described in JP-A-2003-501823, specifically, a coating made of Si, TiN, Mo, Cr or TaSi may be employed. The thickness of the dielectric coating may, for example, be from 10 to 1,000 nm.

The dielectric coating may be formed by a known film-deposition method such as a sputtering method such as a magnetron sputtering method or an ion beam sputtering method, a CVD method, a vacuum vapor deposition method or an electrolytic plating method.

Next, the EUV mask blank of the present invention will be described.

Figure 3:
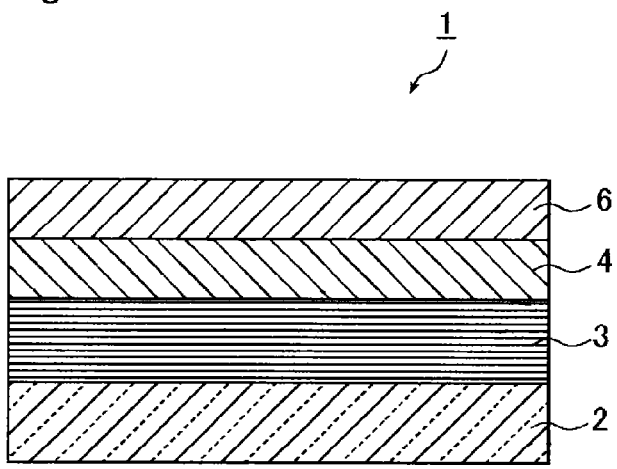
FIG. 3 is a schematic cross-sectional view illustrating an embodiment of the EUV mask blank (A) of the present invention.

FIG. 3 is a schematic cross-sectional view illustrating an embodiment of the EUV mask blank (A) of the present invention. The EUV mask blank 1 shown in FIG. 3 comprises a substrate 2, and a reflective layer 3, an absorber layer 4 and a light shielding layer 6, formed in this order on the substrate 2.

With regard to the constituent material, thickness, demanded characteristics, forming method, etc. of respective components of the EUV mask blank 1, the corresponding portions of the description about the EUV mask may be used as reference.

Figure 4:
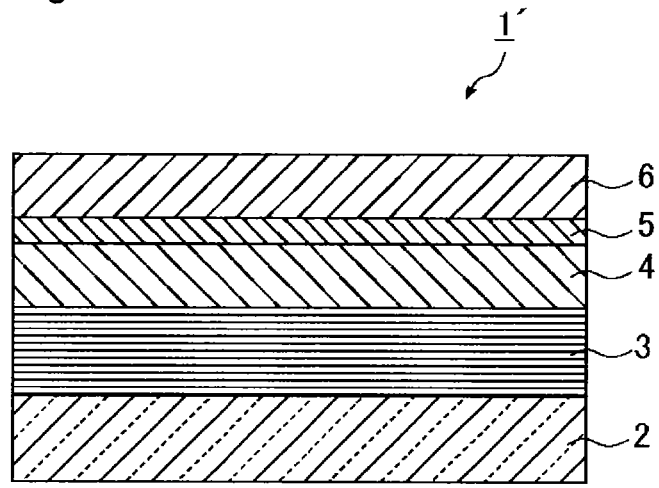
FIG. 4 is a schematic cross-sectional view illustrating an embodiment of the EUV mask blank (B) of the present invention.

FIG. 4 is a schematic cross-sectional view illustrating an embodiment of the EUV mask blank (B) of the present invention. The EUV mask blank 1' shown in FIG. 4 is the same as the EUV mask blank 1 shown in FIG. 3 except that a low reflective layer 5 is present between an absorber layer 4 and a light shielding layer 6.

With regard to the constituent material, thickness, demanded characteristics, forming method, etc. of respective components of the EUV mask blank 1', the corresponding portions of the description about the EUV mask may be used as reference.

Next, the process for producing an EUV mask of the present invention will be described.

A process (1) for producing an EUV mask of the present invention is a process for producing an EUV mask (A) by employing an EUV mask blank (A) of the present invention. Using the EUV mask blank 1 shown in FIG. 3 as an example, the process (1) for producing an EUV mask of the present invention will be described.

Figure 5:
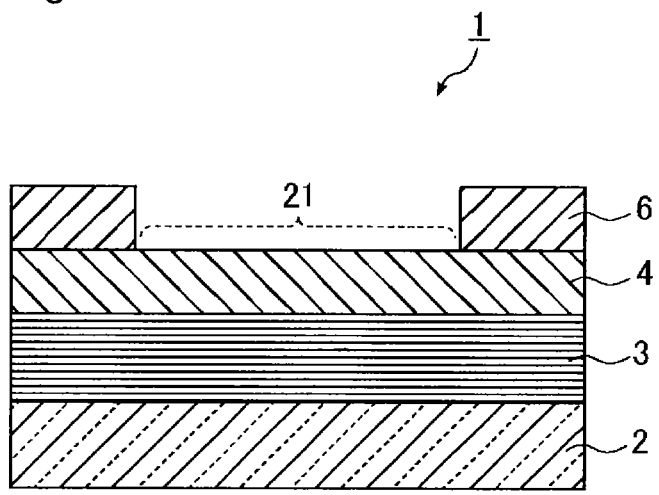
FIG. 5 is a view for explaining the production process (1) of the EUV mask of the present invention.

In the process (1) for producing an EUV mask of the present invention, first, in the EUV mask blank 1, a portion of the light shielding layer 6 present in a portion to be a mask pattern region 21 in an EUVL mask to be produced, is removed to expose an absorber layer 4. The mask blank 1 subjected to this step is shown in FIG. 5. Removal of the light shielding layer 6 may be carried out by a process usually used for forming a mask pattern by a photolithography process. Specifically, for example, the removal may be carried out by the following process.

A resist film is formed on the light shielding layer 6.

A patterning exposure of the resist film to an electron beam or UV rays is carried out.

The resist film after the patterning exposure is developed to form a resist pattern.

An etching process is carried out to remove a portion of the light shielding layer 6 not covered with the resist film.

As the etching process for removing the light shielding layer 6, a dry etching process or a wet etching process may be employed.

Next, a photolithography process is carried out to form a mask pattern in the absorber layer 4 exposed to the outside by the above process. By this process, an EUV mask 10 shown in FIG. 1 is produced.

Here, the process of carrying out the photolithography process to form a mask pattern in the absorber layer 4, may be a common process employed for forming a mask pattern of an EUV mask or a photomask for a dioptric system.

A process (2) for producing an EUV mask of the present invention is a process for producing an EUV mask (B) by employing the EUV mask blank (B) of the present invention.

The process (2) for producing an EUV mask of the present invention is the same as the process (1) for producing an EUV mask of the present invention except that a low reflective layer 5 is exposed to the outside by removing the light shielding layer 6 present in a portion to be a mask pattern region 21 in an EUV mask to be produced, and that a mask pattern is formed in the low reflective layer 5 and the absorber layer 4 present under the low reflective layer 5 by a photolithography process.

In a case of producing an EUV mask (A) by employing the EUV mask blank (A) of the present invention, the following process may be carried out.

Figure 6:
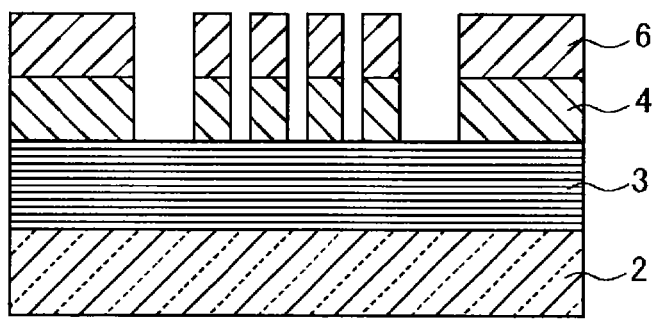
FIG. 6 is a view for explaining an example of a production process of the EUV mask of the present invention.
Figure 7:
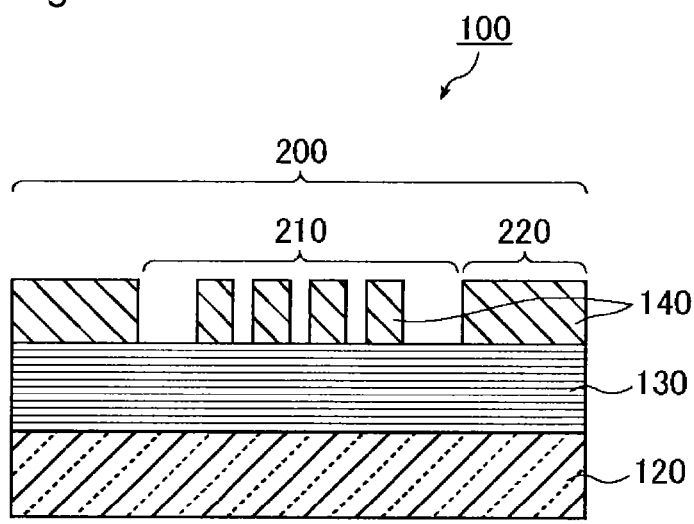
FIG. 7 is a schematic cross-sectional view of an example of a construction of a conventional EUV mask.

For example, in a case of an EUV mask blank 1 shown in FIG. 3, a mask pattern is formed in a light shielding layer 6 and a absorber layer 4 present under the light shielding layer 6 in a portion to be a mask pattern region in an EUV mask to be produced by employing the EUV mask blank, by a photolithography process. In FIG. 6, an EUV mask blank 1 after this step is shown.

Next, by a photolithography process, the light shielding layer 6 present in the portion to be a mask pattern in the EUV mask is removed by a photolithography process to expose the absorber layer 4 to the outside. By this step, an EUV mask 10 shown in FIG. 1 is produced.

In a case of producing an EUV mask (B) from the EUV mask blank (B) of the present invention, a similar process can be carried out. For example, in a case of an EUV mask blank 1' shown in FIG. 4, a mask pattern is formed in a light shielding layer 6, and a low reflective layer 5 and a absorber layer 4 which are present under the light shielding layer 6 present in a region to be a mask pattern region in an EUV mask to be produced by employing the EUV mask blank, by a photolithography process. Next, by a photolithography process, the light shielding layer 6 present in the portion to be the mask pattern region in the EUV mask is removed to expose the low reflective layer 5 to the outside. By this process, an EUV mask 10' shown in FIG. 2 is produced.

Next, a process for producing a semiconductor integrated circuit using the EUV mask of the present invention will be described. The EUV mask of the present invention may be applied to a process for producing a semiconductor integrated circuit using a photolithography process using EUV light as a light source for exposure. Specifically, a substrate such as a silicon wafer coated with a resist is disposed on a stage, and the EUV mask of the present invention is disposed on a catoptric type exposure apparatus constituted by a combination of reflective mirrors. Then, the EUV mask is irradiated with EUV light emitted from a light source via the reflective mirrors, and the substrate coated with a resist is irradiated with the EUV light reflected by the EUV mask. By this pattern transferring step, a circuit pattern is transferred onto the substrate. The substrate on which the circuit pattern is transferred is subjected to development to etch an exposed portion or a non-exposed portion, and the resist is removed. The semiconductor integrated circuit is produced by repeating such steps.

EXAMPLES

Now, the present invention will be further described with reference to Examples. However, it should be understood that the present invention is by no means limited to these Examples.

Example 1

In this Example, an EUV mask blank 1 shown in FIG. 3 is produced to determine whether the desired optical characteristics are satisfied in "the region outside the mask pattern region".

As a substrate 2 for film-deposition, a $SiO_2$—$TiO_2$ type glass substrate (external shape is about 6 inch (about 152 mm) square, and the thickness is about 6.3 mm) is employed. The glass substrate has a thermal expansion coefficient of $0.05 \times 10^{-7}/°$ C., a Young's modulus of 67 GPa, a Poisson's ratio of 0.17 and a specific rigidity of $3.07 \times 10^7$ $m^2/s^2$. The glass substrate is polished to have a smooth surface having a surface roughness (rms) of at most 0.15 nm and a flatness of at most 100 nm.

On the rear surface of the substrate 2, a Cr film having a thickness of 100 nm is deposited by using a magnetron sputtering method to provide a dielectric coating having a sheet resistance of 100Ω/□.

On a common electrostatic chuck having a flat plate shape, the substrate 2 (external shape: 6 inch (152 mm) square, thickness: 6.3 mm) is fixed by using the deposited Cr film, and a cycle of deposition of a Si film and a Mo film on the surface of the substrate 2 by using an ion beam sputtering method is repeated for 40 times to form a Mo/Si multilayer reflective film (reflective layer 3) having a total film thickness of 272 nm ((4.5 nm+2.3 nm)×40).

Further, on the Mo/Si multilayer reflective film (reflective layer 3), a Ru film (thickness: 2.5 nm) is deposited by using an ion beam sputtering method to form a protective layer (not shown in the figure).

Film-deposition conditions of the Si film, Mo film and Ru film are as follows.

Film-Depositing Conditions of Si Film
    Target: Si target (boron-doped)
    Sputtering gas: Ar gas (gas pressure: 0.02 Pa)
    Voltage: 700 V
    Film-deposition speed: 4.62 nm/min
    Film thickness: 4.5 nm Film-Depositing Conditions of Mo Film
    Target: Mo target
    Sputtering gas: Ar gas (gas pressure: 0.02 Pa)
    Voltage: 700 V
    Film-deposition speed: 3.84 nm/min
    Film thickness: 2.3 nm Film-Depositing Conditions of Ru Film
    Target: Ru target
    Sputtering gas: Ar gas (gas pressure: 0.02 Pa)
    Voltage: 500 V
    Film-deposition speed: 1.38 nm/min
    Film thickness: 2.5 nm Next, on the protective layer, an absorber layer 4 (TaNH film) containing Ta, N and H is deposited by using a magnetron sputtering method, to obtain a mask blank having the substrate 2, and the reflective layer 3, the protective layer and the absorber layer 4 in this order on the substrate 2.

The film-deposition conditions of the absorber layer 4 are as follows. The absorber layer 4 has a thickness expected to be required to use the principle of phase shift in relation to reflected light from the reflective layer 3. Specifically, the thickness is set to be 58 nm, whereby the average EUV reflectivity from the surface of the absorber layer 4 measured by the method as described later is 2.2%, and further the phase difference from the reflected light from the reflective layer 3 is from 177 to 183 degrees. Further, the reflectivity in the DUV-Vis wavelength region, specifically at any wavelength of from 190 to 500 nm from the surface of the absorber layer 4 measured by the method as described later is from 35 to 50%.

Film-Deposition Conditions of Absorber Layer 4 (TaNH Film)
    Target: Ta target
    Sputtering gas: mixed gas of Ar, $N_2$ and $H_2$ (Ar: 89 vol %, $N_2$: 8.3 vol %, $H_2$: 2.7 vol %, gas pressure: 0.12 Pa)
    Input power: 1,500 W
    Film-deposition speed: 6.0 nm/min Next, on the absorber layer 4, a light shielding layer 6 (CrO film) containing Cr and O is formed by using a magnetron sputtering method to obtain a mask blank having a substrate 2, and a reflective layer 3, a protective layer, an absorber layer 4 and a light shielding layer 6 in this order on the substrate 2. The film-deposition conditions of the light shielding layer 6 are as follows.

Film-Deposition Conditions of Light Shielding Layer 6 (CrO Film)
    Target: Cr target
    Sputtering gas: mixed gas of Ar and $O_2$ (Ar: 49.4 vol %, $O_2$: 50.6 vol %, gas pressure: 0.12 Pa)
    Input power: 1,500 W
    Deposition speed: 3.0 nm/min
    Film thickness: 25 nm Film Composition of Light Shielding Layer 6 (CrO Film)

The composition of the light shielding layer 6 was measured by using a X-ray photoelectron spectrometer (manufactured by PERKIN ELMER-PHI) and a Ratherford backscattering spectrometer (manufactured by Kobe Steel, Ltd.). The composition of the light shielding layer 6 is Cr:O=25:75.

Evaluation of Reflectivity of Light Shielding Layer 6 for EUV Light and DUV-Vis Light The surface of the mask blank 1 obtained by the above procedure was irradiated with EUV light (wavelength: 13.3 to 13.7 nm) and DUV-Vis light (190 to 500 nm), and the average EUV reflectivity and DUV-Vis reflectivity from the surface of the light shielding layer 6 were measured.

The measurement method of reflectivity for EUV reflected light is as follows. By using synchrotron radiation, first, the intensity of EUV light at the time of incident of EUV light which is spectroscopically separated to have a desired wavelength directly into a photodiode is measured, and successively, the surface of the mask blank is irradiated with EUV light from a direction at 6 degrees to the normal line, and the intensity of the reflected light is measured. The ratio of the intensity of reflected light to the intensity of direct light as measured as above is calculated, whereby it is possible to obtain the reflectivity at a desired wavelength.

On the other hand, the DUV-Vis reflectivity was measured by using a spectrophotometer (UV-4100 (manufactured by Hitachi High-technologies Corporation)) with an incident angle of 5 degrees.

As a result of the measurement by the above method, the average EUV reflectivity at a wavelength of from 13.3 to 13.7 nm from the surfaces of the light shielding layer 6 was 0.4%. Further, the reflectivity in the wavelength region of DUV-Vis light, specifically at any wavelength of from 190 to 500 nm was at most 20%. Although the DUV-Vis reflectivity was measured with an incident angle of 5 degrees, even if the incident angle is 6 degrees, a DUV-Vis reflectivity of at most 20% may be obtained, as well.

The EUV mask as shown in FIG. 1 as an example has an absorber layer 4 and a light shielding layer 6 in combination, whereby it is possible to use the principle of phase shift for EUV light in the relationship between the reflected light from the reflective layer and the reflected light from the absorber layer, in the mask pattern region. Further, it is expected that in the region outside the mask pattern region, the average EUV reflectivity for EUV reflected light and the reflectivity for DUV-Vis light are reduced, and it is thereby possible to suppress unnecessary exposure of a resist formed on a substrate to reflected light from outside the mask pattern region. Further, it is considered that the reflectivity in the DUV-Vis wavelength region, specifically at any wavelength of from 190 to 500 nm from the surface of the absorber layer 4 is from 35 to 50%, which is high, and if no light shielding layer 6 is provided, unnecessary exposure of a resist on a substrate to reflected light from outside the mask pattern region becomes a problem.

Example 2

This Example is the same as Example 1 except that as the light shielding layer 6, a CrON film is formed.

Film-Deposition Conditions of Light Shielding Layer 6 (CrON Film)
    Target: Cr target
    Sputtering gas: mixed gas of Ar, $N_2$ and $O_2$ (Ar: 49.4 vol %, $N_2$: 13.8 vol %, $O_2$: 36.8 vol %, gas pressure: 0.12 Pa)

Input power: 1,500 W
Deposition speed: 3.0 nm/min
Film thickness: 25 nm

Film Composition of Light Shielding Layer 6 (CrON Film)

The composition of the light shielding layer 6 was measured in the same manner as in Example 1, and the result is Cr:O:N=20:70:10.

Evaluation OF Reflectivity of Light Shielding Layer 6 for EUV Light and DUV-Vis Light In the same manner as in Example 1, the surface of the mask blank 1 obtained by the above procedure was irradiated with EUV light (wavelength: 13.3 to 13.7 nm) and DUV-Vis light (190 to 500 nm), and the average EUV reflectivity and DUV-Vis reflectivity from the surface of the light shielding layer 6 were measured.

The average EUV reflectivity at a wavelength of from 13.3 to 13.7 nm from the surfaces of the light shielding layer 6 was 0.3%. Further, the reflectivity in the wavelength region of DUV-Vis light, specifically at any wavelength of from 190 to 500 nm was at most 20%.

The EUV mask as shown in FIG. 1 as an example has an absorber layer 4 and a light shielding layer 6 in combination, whereby it is possible to use the principle of phase shift for EUV light in the relationship between the reflected light from the reflective layer and the reflected light from the absorber layer, in the mask pattern region. Further, it is expected that in the region outside the mask pattern region, the average EUV reflectivity for EUV reflected light and the reflectivity for DUV-Vis light are reduced, and it is thereby possible to suppress unnecessary exposure of a resist formed on a substrate to reflected light from outside the mask pattern region.

Example 3

This Example is the same as Example 1 except that as the light shielding layer 6, a CrO film having a different content ratio of Cr and O is formed.

Film-Deposition Conditions of Light Shielding Layer 6 (CrO Film)

Target: Cr target
Sputtering gas: mixed gas of Ar and $O_2$ (Ar: 40 vol %, $N_2$: 60 vol %, gas pressure: 0.12 Pa)
Input power: 1,500 W
Deposition speed: 2.7 nm/min
Film thickness: 25 nm Film Composition of Light Shielding Layer 6 (CrO Film)

The composition of the light shielding layer 6 was measured in the same manner as in Example 1, and the result is Cr:O=20:80.

Evaluation of Reflectivity of Light Shielding Layer 6 for EUV Light and DUV-Vis Light In the same manner as in Example 1, the surface of the mask blank 1 obtained by the above procedure is irradiated with EUV light (wavelength: 13.3 to 13.7 nm) and DUV-Vis light (190 to 500 nm), and the average EUV reflectivity and DUV-Vis reflectivity from the surface of the light shielding layer 6 are measured.

The average EUV reflectivity at a wavelength of from 13.3 to 13.7 nm from the surfaces of the light shielding layer 6 is 0.4%. Further, the reflectivity in the wavelength region of DUV-Vis light, specifically at any wavelength of from 190 to 500 nm is at most 20%.

The EUV mask as shown in FIG. 1 as an example has an absorber layer 4 and a light shielding layer 6 in combination, whereby it is possible to use the principle of phase shift for EUV light in the relationship between the reflected light from the reflective layer and the reflected light from the absorber layer, in the mask pattern region. Further, it is expected that in the region outside the mask pattern region, the average EUV reflectivity for EUV reflected light and the reflectivity for DUV-Vis light are reduced, and it is thereby possible to suppress unnecessary exposure of a resist formed on a substrate to reflected light from outside the mask pattern region.

Example 4

This Example is the same as Example 1 except that as the light shielding layer 6, a CrON film having a different content ratio of Cr, O and N is formed.

Film-Deposition Conditions of Light Shielding Layer 6 (CrON Film)

Target: Cr target
Sputtering gas: mixed gas of Ar, $N_2$ and $O_2$ (Ar: 50 vol %, $N_2$: 16 vol %, $O_2$: 34 vol %, gas pressure: 0.12 Pa)
Input power: 1,500 W
Deposition speed: 3.2 nm/min
Film thickness: 25 nm Film Composition of Light Shielding Layer 6 (CrON film)

The composition of the light shielding layer 6 was measured in the same manner as in Example 1, and the result is Cr:O:N=25:60:15.

Evaluation of Reflectivity of Light Shielding Layer 6 for EUV Light and DUV-Vis Light In the same manner as in Example 1, the surface of the mask blank 1 obtained by the above procedure is irradiated with EUV light (wavelength: 13.3 to 13.7 nm) and DUV-Vis light (190 to 500 nm), and the average EUV reflectivity and DUV-Vis reflectivity from the surface of the light shielding layer 6 are measured.

The average EUV reflectivity at a wavelength of from 13.3 to 13.7 nm from the surfaces of the light shielding layer 6 is 0.2%. Further, the reflectivity in the wavelength region of DUV-Vis light, specifically at any wavelength of from 190 to 500 nm is at most 20%.

The EUV mask as shown in FIG. 1 as an example has an absorber layer 4 and a light shielding layer 6 in combination, whereby it is possible to use the principle of phase shift for EUV light in the relationship between the reflected light from the reflective layer and the reflected light from the absorber layer, in the mask pattern region. Further, it is expected that in the region outside the mask pattern region, the average EUV reflectivity for EUV reflected light and the reflectivity for DUV-Vis light are reduced, and it is thereby possible to suppress unnecessary exposure of a resist formed on a substrate to reflected light from outside the mask pattern region.

Example 5

This Example is the same as Example 1 except that the light shielding layer 6 has a two-layer structure comprising a CrO film as the upper layer and a CrN film as the lower layer. Further, the film forming conditions for the CrO film as the upper layer of the light shielding layer 6 is the same as in Example 1, but the film thickness was set to be 30 nm.

Film-Deposition Conditions of Lower Layer (CrN Film) of Light Shielding Layer 6

Target: Cr target
Sputtering gas: mixed gas of Ar and $N_2$ (Ar: 58 vol %, $N_2$: 42 vol %, $O_2$: 34 vol %, gas pressure: 0.12 Pa)
Input power: 1,500 W
Deposition speed: 4.0 nm/min
Film thickness: 30 nm Film Composition of Lower Layer (CrN Film) of Light Shielding Layer 6

The composition of the light shielding layer 6 was measured in the same manner as in Example 1, and the result is Cr:N=81:19.

Evaluation of Reflectivity of Light Shielding Layer 6 for EUV Light and DUV-Vis Light In the same manner as in Example 1, the surface of the mask blank 1 obtained by the above procedure is irradiated with EUV light (wavelength: 13.3 to 13.7 nm) and DUV-Vis light (190 to 500 nm), and the average EUV reflectivity and DUV-Vis reflectivity from the surface of the light shielding layer 6 are measured.

The average EUV reflectivity at a wavelength of from 13.3 to 13.7 nm from the surfaces of the light shielding layer 6 is 0.1%. Further, the reflectivity in the wavelength region of DUV-Vis light, specifically at any wavelength of from 190 to 500 nm is at most 20%.

The EUV mask as shown in FIG. 1 as an example has an absorber layer 4 and a light shielding layer 6 in combination, whereby it is possible to use the principle of phase shift for EUV light in the relationship between the reflected light from the reflective layer and the reflected light from the absorber layer, in the mask pattern region. Further, it is expected that in the region outside the mask pattern region, the average EUV reflectivity for EUV reflected light and the reflectivity for DUV-Vis light are reduced, and it is thereby possible to suppress unnecessary exposure of a resist formed on a substrate to reflected light from outside the mask pattern region.

Example 6

This Example is the same as Example 5 except that the light shielding layer 6 has a two-layer structure comprising a CrON film as the upper layer and a CrN film as the lower layer. Further, the film forming conditions for the CrON film as the upper layer of the light shielding layer 6 is the same as in Example 2, but the film thickness was set to be 30 nm. Further, the film forming conditions for the CrN film as the lower layer of the light shielding layer 6 is the same as in Example 5, but the film thickness was set to be 30 nm.

Evaluation of Reflectivity of Light Shielding Layer 6 for EUV Light and DUV-Vis Light In the same manner as in Example 1, the surface of the mask blank 1 obtained by the above procedure is irradiated with EUV light (wavelength: 13.3 to 13.7 nm) and DUV-Vis light (190 to 500 nm), and the average EUV reflectivity and DUV-Vis reflectivity from the surface of the light shielding layer 6 are measured.

The average EUV reflectivity at a wavelength of from 13.3 to 13.7 nm from the surfaces of the light shielding layer 6 is 0.1%. Further, the reflectivity in the wavelength region of DUV-Vis light, specifically at any wavelength of from 190 to 500 nm is at most 20%.

The EUV mask as shown in FIG. 1 as an example has an absorber layer 4 and a light shielding layer 6 in combination, whereby it is possible to use the principle of phase shift for EUV light in the relationship between the reflected light from the reflective layer and the reflected light from the absorber layer, in the mask pattern region. Further, it is expected that in the region outside the mask pattern region, the average EUV reflectivity for EUV reflected light and the reflectivity for DUV-Vis light are reduced, and it is thereby possible to suppress unnecessary exposure of a resist formed on a substrate to reflected light from outside the mask pattern region.

Example 7

This Example is the same as Example 6 except that the light shielding layer 6 has a multilayer structure of a structure (CrON film/CrN film/CrON film) wherein a first layer and a second layer are alternately stacked to form a three-layer stack wherein the first layer is a CrON film, and the second layer is a CrN film. Further, the film-deposition conditions for the CrON film of the light shielding layer 6 is the same as in Example 2, but the thickness of the CrON film of the uppermost layer is set to be 30 nm, and the thickness of the CrON film of the lowermost layer is set to be 15 nm. Further, the film-deposition conditions for the CrN film of the light shielding layer 6 is the same as the CrN film as the lower layer of the light shielding layer in Example 5, and the thickness is set to be 4 nm.

Evaluation of Reflectivity of Light Shielding Layer 6 for EUV Light and DUV-Vis Light In the same manner as in Example 1, the surface of the mask blank 1 obtained by the above procedure is irradiated with EUV light (wavelength: 13.3 to 13.7 nm) and DUV-Vis light (190 to 500 nm), and the average EUV reflectivity and DUV-Vis reflectivity from the surface of the light shielding layer 6 are measured.

The average EUV reflectivity at a wavelength of from 13.3 to 13.7 nm from the surfaces of the light shielding layer 6 is 0.1%. Further, the reflectivity in the wavelength region of DUV-Vis light, specifically at any wavelength of from 190 to 500 nm is at most 15%.

The EUV mask as shown in FIG. 1 as an example has an absorber layer 4 and a light shielding layer 6 in combination, whereby it is possible to use the principle of phase shift for EUV light in the relationship between the reflected light from the reflective layer and the reflected light from the absorber layer, in the mask pattern region. Further, it is expected that in the region outside the mask pattern region, the average EUV reflectivity for EUV reflected light and the reflectivity for DUV-Vis light are reduced, and it is thereby possible to suppress unnecessary exposure of a resist formed on a substrate to reflected light from outside the mask pattern region.

Example 8

This Example is the same as Example 1 except that the absorber layer 4 has a thickness with which the principle of phase shift is not used, specifically the thickness of the absorber layer 4 is set to be 83 nm.

The average EUV reflectivity from the surface of the absorber layer 4 is 0.4%. Further, the reflectivity in the DUV-Vis wavelength region, specifically at any wavelength of from 190 to 500 nm from the surface of the absorber layer 4 is from 35 to 50%.

Next, on the absorber layer 4, the same light shielding layer 6 (CrO film) as in Example 1 is formed to obtain a mask blank having a reflective layer 3, a protective layer, an absorber layer 4 and a light shielding layer 6 in this order on a substrate 2.

Evaluation of Reflectivity of Light Shielding Layer 6 for EUV Light and DUV-Vis Light In the same manner as in Example 1, the surface of the mask blank 1 obtained by the above procedure is irradiated with EUV light (wavelength: 13.3 to 13.7 nm) and DUV-Vis light (190 to 500 nm), and the average EUV reflectivity and DUV-Vis reflectivity from the surface of the light shielding layer 6 are measured.

The average EUV reflectivity at a wavelength of from 13.3 to 13.7 nm from the surfaces of the light shielding layer 6 is 0.2%. Further, the reflectivity in the wavelength region of DUV-Vis light, specifically at any wavelength of from 190 to 500 nm is at most 20%.

The EUV mask as shown in FIG. 1 as an example has an absorber layer 4 and a light shielding layer 6 in combination, whereby it is expected that in the region outside the mask pattern region, even when the absorber layer 4 has a thickness with which the phase effect is not used, the average EUV reflectivity for EUV reflected light and the reflectivity for DUV-Vis light are reduced, and it is thereby possible to suppress unnecessary exposure of a resist formed on a substrate to reflected light from outside the mask pattern region.

Comparative Example 1

This Comparative Example is the same as Example 1 except that as the light shielding layer 6, a Cr film is formed.
Film-Deposition Conditions of Light Shielding Layer 6 (Cr Film)
 Target: Cr target
 Sputtering gas: Ar gas (Ar: 100 vol %, gas pressure: 0.12 Pa)
 Input power: 1,500 W
 Deposition speed: 10 nm/min
 Film thickness: 25 nm
Film Composition of Light Shielding Layer 6 (Cr Film)
 The composition of the light shielding layer 6 was measured in the same manner as in Example 1, and the result is Cr=100.
Evaluation of Reflectivity of Light Shielding Layer 6 FOR DUV-Vis Light
 The surface of the mask blank 1 obtained by the above procedure is irradiated with DUV-Vis light (190 to 500 nm) in the same manner as in Example 1, and the DUV-Vis reflectivity from the surface of the light shielding layer 6 is measured.
 The reflectivity in the wavelength region of DUV-Vis light, specifically at any wavelength of from 190 to 500 nm from the surface of the light shielding layer 6 is more than 35 to 40%. That is, since the reflectivity for DUV-Vis light is high in the region outside the mask pattern region, unnecessary exposure of a resist on a substrate to DUV-Vis reflected light from outside the mask pattern region may be caused.

Comparative Example 2

This Comparative Example is the same as Example 1 except that as the light shielding layer 6, a CrN film is formed.
Film-Deposition Conditions of Light Shielding Layer 6 (CrN Film)
 Target: Cr target
 Sputtering gas: mixed gas of: Ar and $N_2$ (Ar: 80 vol %, $N_2$: 20 vol %, gas pressure: 0.12 Pa)
 Input power: 1,500 W
 Deposition speed: 8.0 nm/min
 Film thickness: 25 nm
Film Composition of Light Shielding Layer 6 (CrN Film)
 The composition of the light shielding layer 6 was measured in the same manner as in Example 1, and the result is Cr:N=70:30.
Evaluation of Reflectivity of Light Shielding Layer 6 for DUV-Vis Light
 The surface of the mask blank 1 obtained by the above procedure is irradiated with DUV-Vis light (190 to 500 nm) in the same manner as in Example 1, and the DUV-Vis reflectivity from the surface of the light shielding layer 6 is measured.
 The reflectivity in the wavelength region of DUV-Vis light, specifically at any wavelength of from 190 to 500 nm from the surface of the light shielding layer 6 is more than 40%. That is, since the reflectivity for DUV-Vis light is high in the region outside the mask pattern region, unnecessary exposure of a resist on a substrate to DUV-Vis reflected light from outside the mask pattern region may be caused.

Comparative Example 3

This Comparative Example is the same as Example 1 except that as the light shielding layer 6, a CrO film having a Cr content of more than 40 at % is formed.
Film-Deposition Conditions of Light Shielding Layer 6 (CrO Film)
 Target: Cr target
 Sputtering gas: mixed gas of: Ar and $O_2$ (Ar: 80 vol %, $O_2$: 20 vol %, gas pressure: 0.12 Pa)
 Input power: 1,500 W
 Deposition speed: 7.0 nm/min
 Film thickness: 25 nm
Film Composition of Light Shielding Layer 6 (CrO Film)
 The composition of the light shielding layer 6 was measured in the same manner as in Example 1, and the result is Cr:O=45:55.
Evaluation of Reflectivity of Light Shielding Layer 6 for DUV-Vis Light
 The surface of the mask blank 1 obtained by the above procedure is irradiated with DUV-Vis light (190 to 500 nm) in the same manner as in Example 1, and the DUV-Vis reflectivity from the surface of the light shielding layer 6 is measured.
 The reflectivity in the wavelength region of DUV-Vis light, specifically at any wavelength of from 190 to 500 nm from the surface of the light shielding layer 6 is more than 30%. That is, since the reflectivity for DUV-Vis light is high in the region outside the mask pattern region, unnecessary exposure of a resist on a substrate to DUV-Vis reflected light from outside the mask pattern region may be caused.

Comparative Example 4

This Comparative Example is the same as Example 1 except that as the light shielding layer 6, a CrO film having a Cr content of less than 15 at % is formed. Film-Deposition Conditions of Light Shielding Layer 6 (CrO Film)
 Target: Cr target
 Sputtering gas: mixed gas of: Ar and $O_2$ (Ar: 20 vol %, $O_2$: 80 vol %, gas pressure: 0.12 Pa)
 Input power: 1,500 W
 Deposition speed: 1.0 nm/min
 Film thickness: 25 nm
Film Composition of Light Shielding Layer 6 (CrO Film)
 The composition of the light shielding layer 6 was measured in the same manner as in Example 1, and the result is Cr:O=14:86.
Evaluation of Reflectivity of Light Shielding Layer 6 for EUV Light
 The surface of the mask blank 1 obtained by the above procedure was irradiated with EUV light (wavelength: 13.3 to 13.7 nm) in the same manner as in Example 1, and the average EUV reflectivity from the surface of the light shielding layer 6 was measured.
 The average EUV reflectivity at a wavelength of from 13.3 to 13.7 nm from the surface of the light shielding layer 6 is 0.9%, which is not less than 0.5%. That is, since the average EUV reflectivity for EUV reflected light is high in the region outside the mask pattern region, unnecessary exposure of a resist on a substrate to EUV reflected light from outside the mask pattern region may be caused.

Comparative Example 5

This Comparative Example is the same as Example 2 except that as the light shielding layer 6, a CrON film having a Cr content of more than 40 at % is formed.
Film-Deposition Conditions of Light Shielding Layer 6 (CrON Film)
 Target: Cr target
 Sputtering gas: mixed gas of: Ar, $N_2$ and $O_2$ (Ar: 80 vol %, $N_2$: 10 vol %, $O_2$: 10 vol %, gas pressure: 0.12 Pa)
 Input power: 1,500 W
 Deposition speed: 7.0 nm/min
 Film thickness: 25 nm
Film Composition of Light Shielding Layer 6 (CrON Film)
The composition of the light shielding layer 6 was measured in the same manner as in Example 1, and the result is Cr:O:N=45:30:25.
Evaluation of Reflectivity of Light Shielding Layer 6 for DUV-Vis Light
The surface of the mask blank 1 obtained by the above procedure is irradiated with DUV-Vis light (190 to 500 nm) in the same manner as in Example 1, and the DUV-Vis reflectivity from the surface of the light shielding layer 6 was measured.
The reflectivity in the wavelength region of DUV-Vis light, specifically at any wavelength of from 190 to 500 nm from the surface of the light shielding layer 6 is more than 30%. That is, since the reflectivity for DUV-Vis light is high in the region outside the mask pattern region, unnecessary exposure of a resist on a substrate to DUV-Vis reflected light from outside the mask pattern region may be caused.

Comparative Example 6

This Comparative Example is the same as Example 2 except that as the light shielding layer 6, a CrON film having a Cr content of less than 15 at % is formed.
Film-Deposition Conditions of Light Shielding Layer 6 (CrON film)
 Target: Cr target
 Sputtering gas: mixed gas of: Ar, $N_2$ and $O_2$ (Ar: 20 vol %, $N_2$: 20 vol %, $O_2$: 60 vol %, gas pressure: 0.12 Pa)
 Input power: 1,500 W
 Deposition speed: 1.0 nm/min
 Film thickness: 25 nm
Film Composition of Light Shielding Layer 6 (CrON Film)
The composition of the light shielding layer 6 was measured in the same manner as in Example 1, and the result is Cr:O:N=14:45:41.
Evaluation of Reflectivity of Light Shielding Layer 6 for EUV Light
The surface of the mask blank 1 obtained by the above procedure was irradiated with EUV light (wavelength: 13.3 to 13.7 nm) in the same manner as in Example 1, and the average EUV reflectivity from the surface of the light shielding layer 6 was measured.
The average EUV reflectivity at a wavelength of from 13.3 to 13.7 nm from the surface of the light shielding layer 6 is 0.9%, which is not less than 0.5%. That is, since the average EUV reflectivity for EUV reflected light is high in the region outside the mask pattern region, unnecessary exposure of a resist on a substrate to EUV reflected light from outside the mask pattern region may be caused.

The entire disclosures of Japanese Patent Application No. 2012-016597 filed on Jan. 30, 2012, Japanese Patent Application No. 2012-174704 filed on Aug. 7, 2012 and Japanese Patent Application No. 2012-250089 filed on Nov. 14, 2012, including specifications, claims, drawings and summaries are incorporated herein by reference in their entireties.

REFERENCE SYMBOLS 1, 1': EUV mask blank
2: Substrate
3: Reflective layer
4: Absorber layer
5: Low reflective layer
6: Light shielding layer
10, 10': EUV mask
21: Mask pattern region
22: Region outside mask pattern region
100: EUV mask
120: Substrate
130: Reflective layer
140: Absorber layer
200: Real exposure region
210: Mask pattern region
220: Region outside mask pattern region

What is claimed is:

1. A reflective mask for EUV lithography (EUVL) having a mask pattern region and a region outside the mask pattern region on a substrate, wherein
 in the mask pattern region, a reflective layer for reflecting EUV light is formed on the substrate, and on the reflective layer, a portion having an absorber layer for absorbing EUV light provided and a portion having no absorber layer provided are arranged to form a mask pattern; and
 in the region outside the mask pattern region, a reflective layer for reflecting EUV light, an absorber layer for absorbing EUV light and a light shielding layer for suppressing reflection of EUV light and DUV-Vis light having a wavelength of from 190 to 500 nm are formed in this order on the substrate; and
 wherein in the region outside the mask pattern region, the average EUV reflectivity at a wavelength range of from 13.3 to 13.7 nm from the surface of the light shielding layer is less than 0.5%, and the DUV-Vis reflectivity at a wavelength of from 190 to 500 nm from the surface of the light shielding layer is at most 30%.

2. The reflective mask for EUVL according to claim 1, wherein the light shielding layer contains chromium (Cr) and oxygen (O), and in the light shielding layer, the Cr content is from 15 to 40 at %, and the O content is from 60 to 85 at %.

3. The reflective mask for EUVL according to claim 1, wherein the light shielding layer contains chromium (Cr), oxygen (O) and nitrogen (N); and in the light shielding layer, the Cr content is from 15 to 40 at %, the total content of O and N is from 60 to 85 at %, and the compositional ratio of O to N is from 9:1 to 5:5.

4. The reflective mask for EUVL according to claim 1, wherein the light shielding layer has a two-layer structure comprising a layer (upper layer) on the surface side and a layer (lower layer) on the substrate side, wherein:
 the upper layer of the light shielding layer contains chromium (Cr) and oxygen (O);
 and the Cr content is from 15 to 40 at %, and the O content is from 60 to 85 at %; and
 the lower layer of the light shielding layer contains Cr and nitrogen (N); and the Cr content is from 40 to 97 at %, and the N content is from 3 to 60 at %.

5. The reflective mask for EUVL according to claim 1, wherein the light shielding layer has a two-layer structure comprising a layer (upper layer) on the surface side and a layer (lower layer) on the substrate side, wherein:
the upper layer of the light shielding layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and
the lower layer of the light shielding layer contains Cr and N; and the Cr content is from 40 to 97 at %, and the N content is from 3 to 60 at %.

6. The reflective mask for EUVL according to claim 5, wherein in the light shielding layer, an interlayer is present between the upper layer and the lower layer.

7. The reflective mask for EUVL according to claim 5, wherein in the light shielding layer, the thickness of the upper layer is from 5 to 80 nm, the thickness of the lower layer is from 5 to 80 nm, and the total thickness of the upper layer and the lower layer is from 10 to 100 nm.

8. The reflective mask for EUVL according to claim 1, wherein the light shielding layer has a multilayer structure having at least 3 layers, wherein a first layer and a second layer which are alternately stacked from the absorber layer side, wherein:
each of the first layer and the second layer is selected from the group consisting of a film containing chromium (Cr) and oxygen (O), a film containing chromium (Cr) and nitrogen (N) and a film containing chromium (Cr), oxygen (O) and nitrogen (N), provided that the film compositions of the first layer and the second layer are different from each other.

9. The reflective mask for EUVL according to claim 8, wherein in the multilayer structure:
the first layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and
the second layer contains Cr and nitrogen (N); and the Cr content is from 40 to 97 at %, and the N content is from 3 to 60 at %.

10. The reflective mask for EUVL according to claim 1, wherein the thickness of the light shielding layer is from 10 to 100 nm.

11. A reflective mask for EUV lithography (EUVL) having a mask pattern region and a region outside the mask pattern region on a substrate, wherein
in the mask pattern region, a reflective layer for reflecting EUV light is formed on the substrate, and on the reflective layer, a portion having an absorber layer for absorbing EUV light and a low reflective layer for improving contrast at the time of inspection of a mask pattern, provided in this order, and a portion having no absorber layer or low reflective layer provided are arranged to form a mask pattern; and
in the region outside the mask pattern region, a reflective layer for reflecting EUV light, an absorber layer for absorbing EUV light, a low reflective layer for improving contrast at the time of pattern inspection and a light shielding layer for suppressing reflection of EUV light and DUV-Vis light are formed in this order on the substrate; and
wherein in the region outside the mask pattern region, the average EUV reflectivity at a wavelength range of from 13.3 to 13.7 nm from the surface of the light shielding layer is less than 0.5%, and the DUV-Vis reflectivity at a wavelength of from 190 to 500 nm from the surface of the light shielding layer is at most 30%.

12. A reflective mask blank for EUVL, having a reflective layer for reflecting EUV light, an absorber layer for absorbing EUV light and a light shielding layer for suppressing reflection of EUV light and DUV-Vis light, formed in this order on a substrate, wherein the average EUV reflectivity at a wavelength range of from 13.3 to 13.7 nm from the surface of the light shielding layer is less than 0.5%, and the DUV-Vis reflectivity at a wavelength of from 190 to 500 nm from the surface of the light shielding layer is at most 30%.

13. A reflective mask blank for EUVL, having a reflective layer for reflecting EUV light, an absorber layer for absorbing EUV light, a low reflective layer for improving contrast at the time of pattern inspection and a light shielding layer for suppressing reflection of EUV light and DUV-Vis light, formed in this order on a substrate, wherein the average EUV reflectivity at a wavelength range of from 13.3 to 13.7 nm from the surface of the light shielding layer is less than 0.5%, and the DUV-Vis reflectivity at a wavelength of from 190 to 500 nm from the surface of the light shielding layer is at most 30%.

14. The reflective mask blank for EUVL according to claim 12, wherein the light shielding layer contains chromium (Cr), oxygen (O) and nitrogen (N); and in the light shielding layer, the Cr content is from 15 to 40 at %, the total content of O and N is from 60 to 85 at %, and the compositional ratio of O to N is from 9:1 to 5:5.

15. The reflective mask blank for EUVL according to claim 12, wherein the light shielding layer has a two-layer structure comprising a layer (upper layer) on the surface side and a layer (lower layer) on the substrate side, wherein:
the upper layer of the light shielding layer contains chromium (Cr) and oxygen (O); and the Cr content is from 15 to 40 at %, and the O content is from 60 to 85 at %; and
the lower layer of the light shielding layer contains Cr and nitrogen (N); and the Cr content is from 40 to 97 at %, and the N content is from 3 to 60 at %.

16. The reflective mask blank for EUVL according to claim 12, wherein the light shielding layer has a two-layer structure comprising a layer (upper layer) on the surface side and a layer (lower layer) on the substrate side, wherein:
the upper layer of the light shielding layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and
the lower layer of the light shielding layer contains Cr and N; and the Cr content is from 40 to 97 at %, and the N content is from 3 to 60 at %.

17. The reflective mask blank for EUVL according to claim 16, wherein in the light shielding layer, an interlayer is present between the upper layer and the lower layer.

18. The reflective mask blank for EUVL according to claim 16, wherein in the light shielding layer, the thickness of the upper layer is from 5 to 80 nm, the thickness of the lower layer is from 5 to 80 nm, and the total thickness of the upper layer and the lower layer is from 10 to 100 nm.

19. The reflective mask blank for EUVL according to claim 12, wherein the light shielding layer has a multilayer structure having at least 3 layers, wherein a first layer and a second layer which are alternately stacked from the absorber layer side, wherein:
each of the first layer and the second layer is selected from the group consisting of a film containing chromium (Cr) and oxygen (O), a film containing chromium (Cr) and nitrogen (N) and a film containing chromium (Cr), oxygen (O) and nitrogen (N), provided that the film compositions of the first layer and the second layer are different from each other.

20. The reflective mask blank for EUVL according to claim 19, wherein in the multilayer structure:
the first layer contains chromium (Cr), oxygen (O) and nitrogen (N); and the Cr content is from 15 to 40 at %, the total content of O and N is from 60 to 85 at %, and the compositional ratio of O to N is from 9:1 to 5:5; and
the second layer contains Cr and nitrogen (N); and the Cr content is from 40 to 97 at %, and the N content is from 3 to 60 at %.

21. The reflective mask blank for EUVL according to claim 12, wherein the thickness of the light shielding layer is from 10 to 100 nm.

22. The reflective mask blank for EUVL according to claim 12, wherein the light shielding layer contains chromium (Cr) and oxygen (O), and in the light shielding layer, the Cr content is from 15 to 40 at %, and the O content is from 60 to 85 at %.

* * * * *